(12) United States Patent
Yokota et al.

(10) Patent No.: US 7,524,552 B2
(45) Date of Patent: Apr. 28, 2009

(54) COPPER FOIL PROVIDED WITH DIELECTRIC LAYER FOR FORMING CAPACITOR LAYER, COPPER CLAD LAMINATE FOR FORMATION OF CAPACITOR LAYER USING SUCH COPPER FOIL WITH DIELECTRIC LAYER, AND METHOD FOR MANUFACTURING PRODUCING SUCH COPPER FOIL WITH DIELECTRIC LAYER FOR FORMATION OF CAPACITOR LAYER

(75) Inventors: Toshiko Yokota, Saitama (JP);
Tetsuhiro Matsunaga, Saitama (JP);
Susumu Takahashi, Saitama (JP);
Hideaki Matsushima, Saitama (JP);
Takuya Yamamoto, Saitama (JP);
Makoto Dobashi, Saitama (JP)

(73) Assignee: Mitsui Mining and Smelting Co., Ltd., Tokyo (JP)

( * ) Notice: Subject to any disclaimer, the term of this patent is extended or adjusted under 35 U.S.C. 154(b) by 307 days.

(21) Appl. No.: 10/532,717

(22) PCT Filed: Oct. 29, 2003

(86) PCT No.: PCT/JP03/13818

§ 371 (c)(1),
(2), (4) Date: Sep. 29, 2005

(87) PCT Pub. No.: WO2004/040604

PCT Pub. Date: May 13, 2004

(65) Prior Publication Data

US 2006/0057420 A1 Mar. 16, 2006

(30) Foreign Application Priority Data

Oct. 30, 2002 (JP) ............................. 2002-315894

(51) Int. Cl.
*B32B 3/00* (2006.01)
*B65D 85/00* (2006.01)
(52) U.S. Cl. ....................... 428/210; 428/209; 174/259; 361/314; 205/188; 205/317
(58) Field of Classification Search ......... 428/209–210; 205/122, 188, 317; 174/259; 361/314
See application file for complete search history.

(56) References Cited

U.S. PATENT DOCUMENTS 5,685,968 A * 11/1997 Hayakawa et al. .......... 205/122
5,835,339 A * 11/1998 Sakamoto et al. ......... 361/321.2

FOREIGN PATENT DOCUMENTS

EP 0514 149 A1 * 11/1992

(Continued)

*Primary Examiner*—Cathy F. Lam
(74) *Attorney, Agent, or Firm*—Rothwell, Figg, Ernst & Manbeck, P.C.

(57) ABSTRACT

To provide a dielectric-layer-provided copper foil or the like for extremely improving the product yield while making the most use of the increase effect of an electric capacity of a thin dielectric layer using the sputtering vapor deposition method.

In the case of dielectric-layer-provided copper foils respectively having a dielectric layer on one side of a copper foil, the dielectric layer 6 is an inorganic-oxide sputter film having a thickness of 1.0 μm or less and formed on the one side of the copper foil in accordance with the sputtering vapor deposition method and the dielectric-layer-provided copper foils for respectively forming a capacitor layer, characterized in that a pit-like defective portion generated on the inorganic-oxide sputter film is sealed by polyimide resin are used.

29 Claims, 22 Drawing Sheets

(a)

(b)

FOREIGN PATENT DOCUMENTS

| | | |
|---|---|---|
| JP | 3-016110 | 1/1991 |
| JP | 03-16110 A | 1/1991 |
| JP | 10-27729 A | 1/1998 |
| JP | 11-97289 | 4/1999 |
| JP | 11-97289 A | 4/1999 |
| JP | 2000-178793 A | 6/2000 |
| JP | 2001-185649 | 7/2001 |
| JP | 2001-185649 A | 7/2001 |
| JP | 2002-367856 | 12/2002 |
| JP | 2002-367856 A | 12/2002 |

* cited by examiner (a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

COPPER FOIL PROVIDED WITH DIELECTRIC LAYER FOR FORMING CAPACITOR LAYER, COPPER CLAD LAMINATE FOR FORMATION OF CAPACITOR LAYER USING SUCH COPPER FOIL WITH DIELECTRIC LAYER, AND METHOD FOR MANUFACTURING PRODUCING SUCH COPPER FOIL WITH DIELECTRIC LAYER FOR FORMATION OF CAPACITOR LAYER

CROSS REFERENCE TO RELATED APPLICATION

This application is a 35 USC § 371 National Phase Entry Application from PCT/JP2003/013818, filed Oct. 29, 2003, and designating the United States.

1. Technical Field

The present invention relates to a copper foil provided with a dielectric layer for forming a capacitor layer, a copper clad laminate for forming the capacitor layer using the copper foil provided with the dielectric layer, and a method for manufacturing the copper foil provided with the dielectric layer for forming the capacitor layer.

2. Background Art

It has been generalized in recent years to form a capacitor structure by a method same as the method for forming a circuit shape on an inner layer portion of a printed wiring board, particularly of a multilayer printed wiring board and use the capacitor structure as an embedded capacitor. By forming the capacitor structure on the inner layer portion of the multilayer printed wiring board, it has been possible to omit a capacitor set to the outer layer face, decrease an outer layer circuit in size and increase the outer layer circuit in density, decrease the number of surface-mounted components, and simplify manufacturing of a printed wiring board provided with a fine pitch circuit.

The capacitor structure using a copper clad laminate is formed by using a both-side copper clad laminate constituted by so-called both-side copper foil layers and a dielectric layer located between the both copper foil layers, thereby etching the both-side copper foil layers into a desired-shaped capacitor electrodes, and forming a capacitor structure obtained by holding the dielectric layer between the both-side capacitor electrodes at a purposed position.

Moreover, it is obtained as a basic quality for a capacitor to have the maximum electric capacity. The capacity (C) of the capacitor is calculated from the expression of $C = \varepsilon \varepsilon_0 (A/d)$ ($\varepsilon_0$ is dielectric constant). Therefore, to increase a capacitor capacity, I. the surface area (A) of a capacitor electrode is increased, II. the thickness (d) of a dielectric layer is decreased, and III. the relative dielectric constant of the dielectric layer (E) is increased. It is only necessary to use any one of these methods. Therefore, to decrease the thickness (d) of the dielectric layer in the above Item II., a method for forming a dielectric layer as a thin film by using the so-called dry method such as a sputtering vacuum deposition method or a vapor-phase chemical reaction method is adopted.

The technical background described above is disclosed in Japanese Patent Laid-Open Nos. 10-27729 and 2000-178793.

However, the sputtering vacuum deposition method is superior in a point of forming a very thin film but as the thickness decreases, the quality of a formed film tends to deteriorate. That is, in the case of a thin film of 1.0 μm or less formed by the sputtering vapor deposition method, deposition of an object to be landed of a component to be landed at the time of vapor deposition becomes ununiform and many pit-like detects are observed.

In this case, troubles caused by the present of pits are specifically described below. For example, a case is assumed in which a thin film of tantalum oxide is formed as a dielectric layer by the sputtering vapor deposition method on one side of a copper foil used as a lower electrode and an upper electrode is directly formed on the dielectric layer and to use the upper electrode as a copper clad laminate for forming the capacitor layer of a printed wiring board. In this case, when a pit-like defect is present on the dielectric layer, a short circuit occurs between the lower electrode and the upper electrode at the present position of the pit, the function of a capacitor does not work, and the short circuit becomes a factor for deteriorating the product yield.

Therefore, a component material used for a copper clad laminate for forming a capacitor layer capable of greatly improving the product yield while making the most use of the advantage of the increase effect of the electric capacity of a thin dielectric layer formed by the sputtering vapor deposition method and a method for manufacturing the copper clad laminate are requested in a market.

DISCLOSURE OF THE INVENTION

Therefore, as a result of earnestly studying, the present inventors et al. has conceived a dielectric-layer-provided copper foil for forming a capacitor layer shown below, a copper clad laminate for forming a capacitor layer using the dielectric-layer-provided copper foil, and a method for manufacturing the dielectric-layer-provided copper foil for forming a capacitor layer.

A. Copper Foil Provided with Dielectric Layer

<Basic Configuration of Copper Foil Provided with Dielectric Layer>

The basic feature of a copper foil provided with a dielectric layer of the present invention for forming a capacitor layer is "in the copper foil provided with the dielectric layer on one side of the copper foil, the dielectric layer is an inorganic-oxide sputter film having a thickness of 1.0 μm or less formed by the sputtering vapor deposition method on one side of the copper foil and is obtained by sealing a pit detective portion formed on the inorganic-oxide sputter film with polyimide resin."

Figure 1:
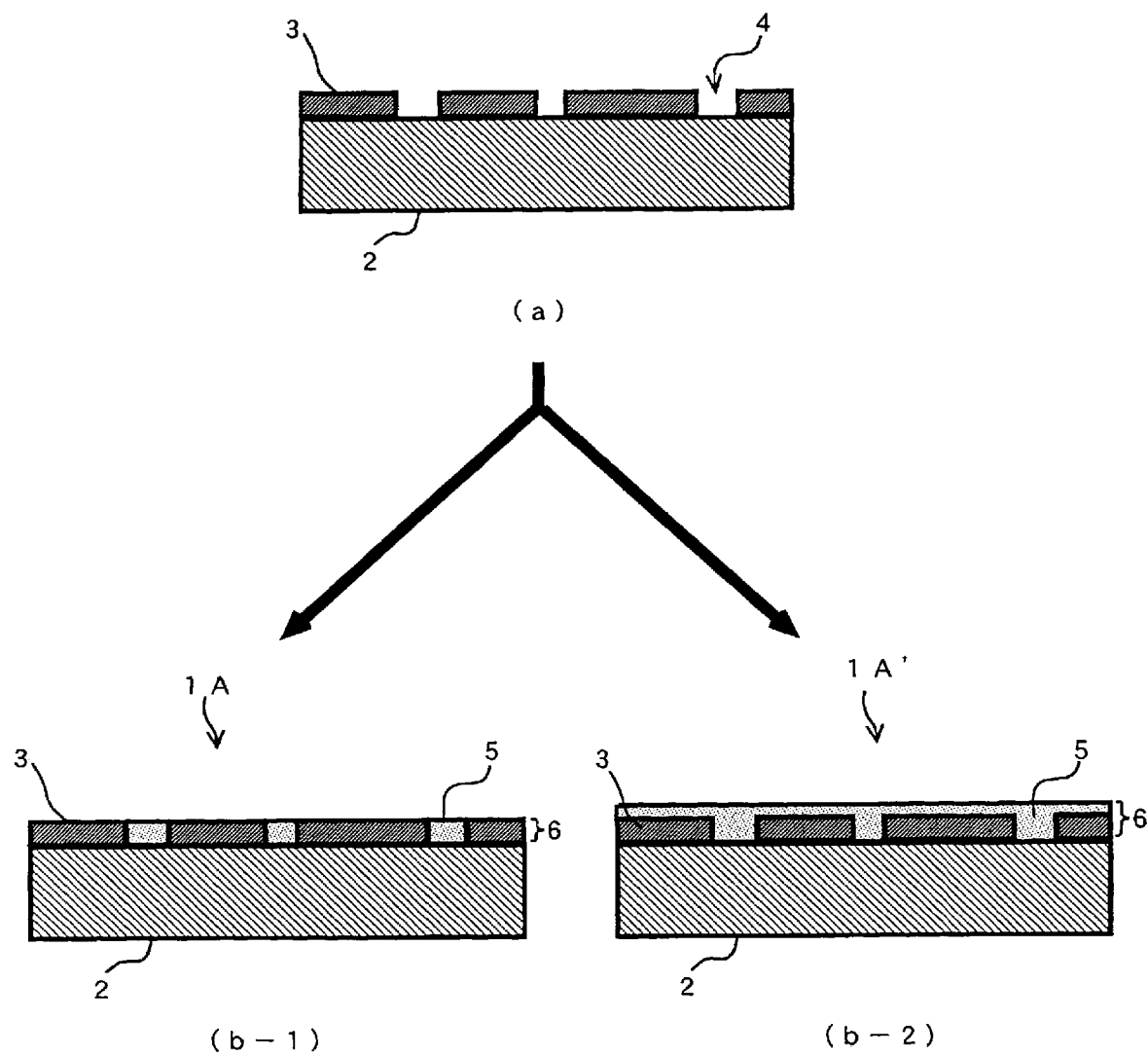
FIGS. 1 to 6 show schematic sectional views of a copper foil provided with a dielectric layer of the present invention. Among FIGS. 1 to 6, FIGS. 2 and 6 illustratively show a case of using a copper foil provided with a carrier foil instead of a copper foil.

FIGS. 1(*a*), (*b*-1), and (*b*-2) show schematic sectional views of dielectric-layer-provided copper foils 1A and 1A' for respectively forming the capacitor layer. That is, as shown in FIG. 1(*a*), when forming an inorganic-oxide sputter film 3 at one side of a copper foil 2, a pit-like detective portion 4 is produced therein. Therefore, by sealing the pit-like defective portion 4 with polyimide resin 5, a dielectric layer 6 formed by an inorganic-oxide sputter film 3 and polyimide resin 5 is constituted and becomes a dielectric-layer-provided copper foil 1 of either conformations of FIG. 1(b-1) or FIG. 1(b-2). FIG. 1(b-1) is an image obtained by embedding and sealing only the pit-like defective portion 4 of the inorganic-oxide sputter film 3 with the polyimide resin 5 and FIG. 1(b-2) is an image in which the polyimide resin 5 embeds and seals the pit-like defective portion 4 of the inorganic-oxide sputter film 3 and a thin polyimide resin layer covers the surface of the inorganic-oxide sputter film 3. However, the thickness of each layer shown in drawings in this description is not obtained by directly reflecting states of real embodied products but it is emphatically shown so that description is easily understood. Moreover, the same symbol is used to point out the same portion as much as possible.

<Copper Foil Constituting Dielectric-layer-provided Copper Foil>

General copper foil: A copper foil constituting a dielectric-layer-provided copper foil for forming a capacitor layer of the present invention is described. The concept usable as a copper foil is used a concept including a copper foil obtained through the electrolytic method and a copper foil obtained through the rolling method. Moreover, concerning a copper foil, even if using the so-called untreated copper foil to which roughing or rust proofing is not applied at all as a copper foil or using the so-called surface-treated copper foil to which the surface treatment obtained by properly combining roughing for attaching minute copper particles to the copper foil to obtain the anchor effect for improving the adhesiveness with he dielectric layer 6 and/or rust proofing for preventing oxidation corrosion is applied, there is no problem. Drawings in this description respectively show a case of using an untreated copper not undergoing a surface treatment is used.

Carrier-foil-provided electrodeposited copper foil: Moreover, to decrease the copper foil 2 in thickness, it is also possible to use the carrier-foil-provided copper foil 7 shown in FIG. 2(a). The carrier-foil-provided copper foil 7 is a foil obtained by combining a carrier foil 8 and a copper foil 2 together through a junction interface layer 9. When using the carrier-foil-provided copper foil 7, it is only necessary to form the dielectric layers 6 shown in FIGS. 2(b-1) and 2(b-2) on the surface of the copper foil 2 of the carrier-foil-provided copper foil 7 and form them into dielectric-layer-provided copper foils 1B and 1B' followed by the carrier foil 8. Moreover, it is only necessary to form an upper electrode on the surface of the dielectric layer 6 by a method to be mentioned later and then, remove a carrier foil.

Figure 3:
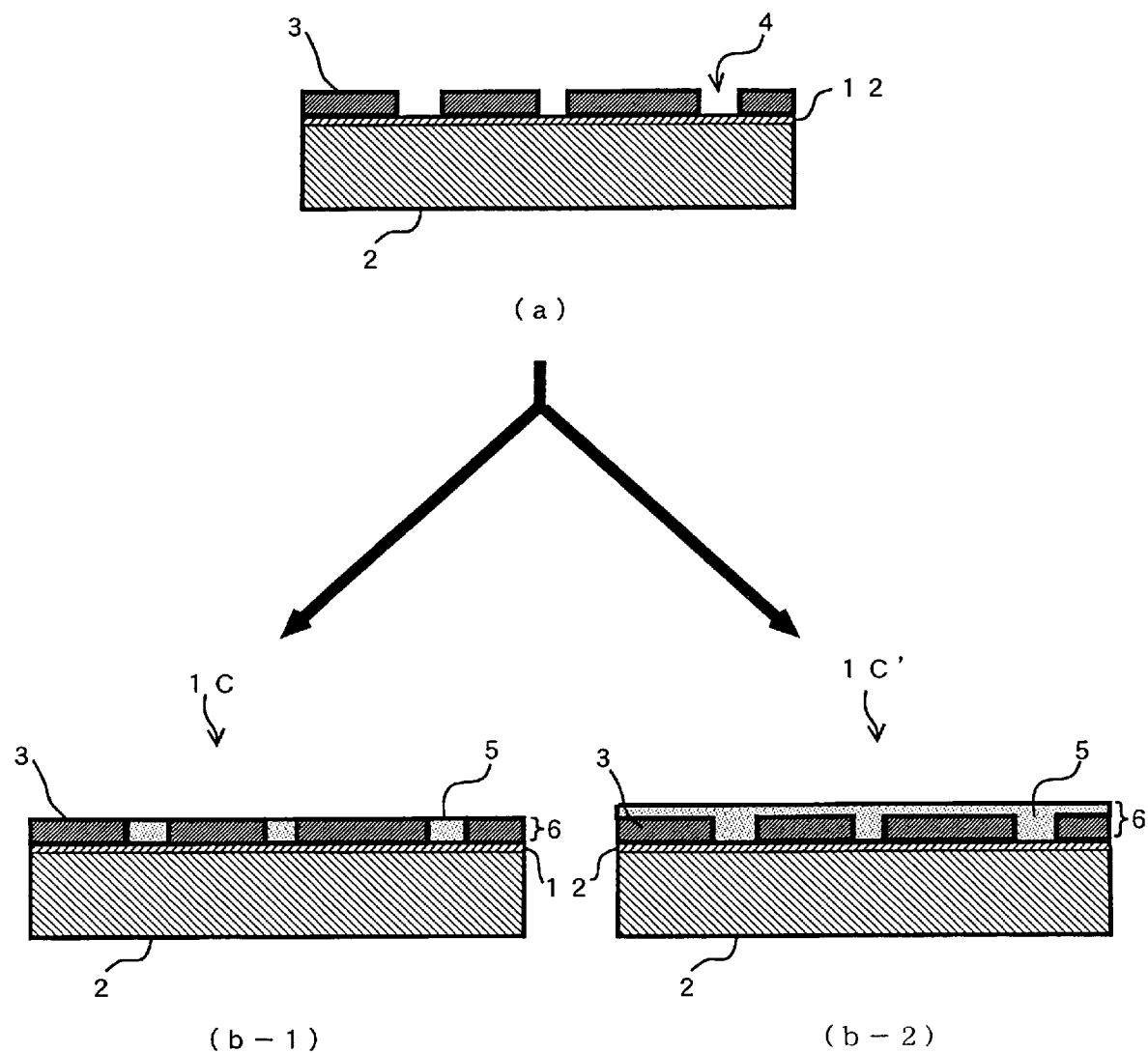

Copper foil provided with binder metal layer: The binder metal layer is used to improve the adhesiveness between a dielectric layer and an electrode forming layer. Therefore, as shown in FIG. 3, the binder metal layer 12 is set so as to contact with the dielectric layer 6. Moreover, a material having the best adhesiveness with a material used to constitute the dielectric layer is properly selectively used. However, when the binder metal layer described above becomes too thick, it is difficult to remove it through etching and the binder metal layer becomes etching remainder. Therefore, it is preferable to minimize the thickness of the binder metal layer.

It is enough that the binder metal layer 12 is a very thin metal layer having a thickness such being 30 nm to 0.5 μm and it is considered that forming the layer by a dry method such as the sputtering vapor deposition method is the most suitable manufacturing method. Moreover, a binder metal layer capable of improving the adhesiveness between an upper electrode forming layer and a metal-oxide sputtering layer or polyimide layer uses any one of such materials as cobalt, chromium, nickel, nickel-chromium alloy, zirconium, palladium, molybdenum, tungsten, titanium, aluminum, and platinum. Furthermore, it is possible to use the binder metal layer 12 by considering the consistency with the material of a layer with which the layer 12 contacts and thereby forming any one of the above materials into a plurality of layers.

Figure 4:
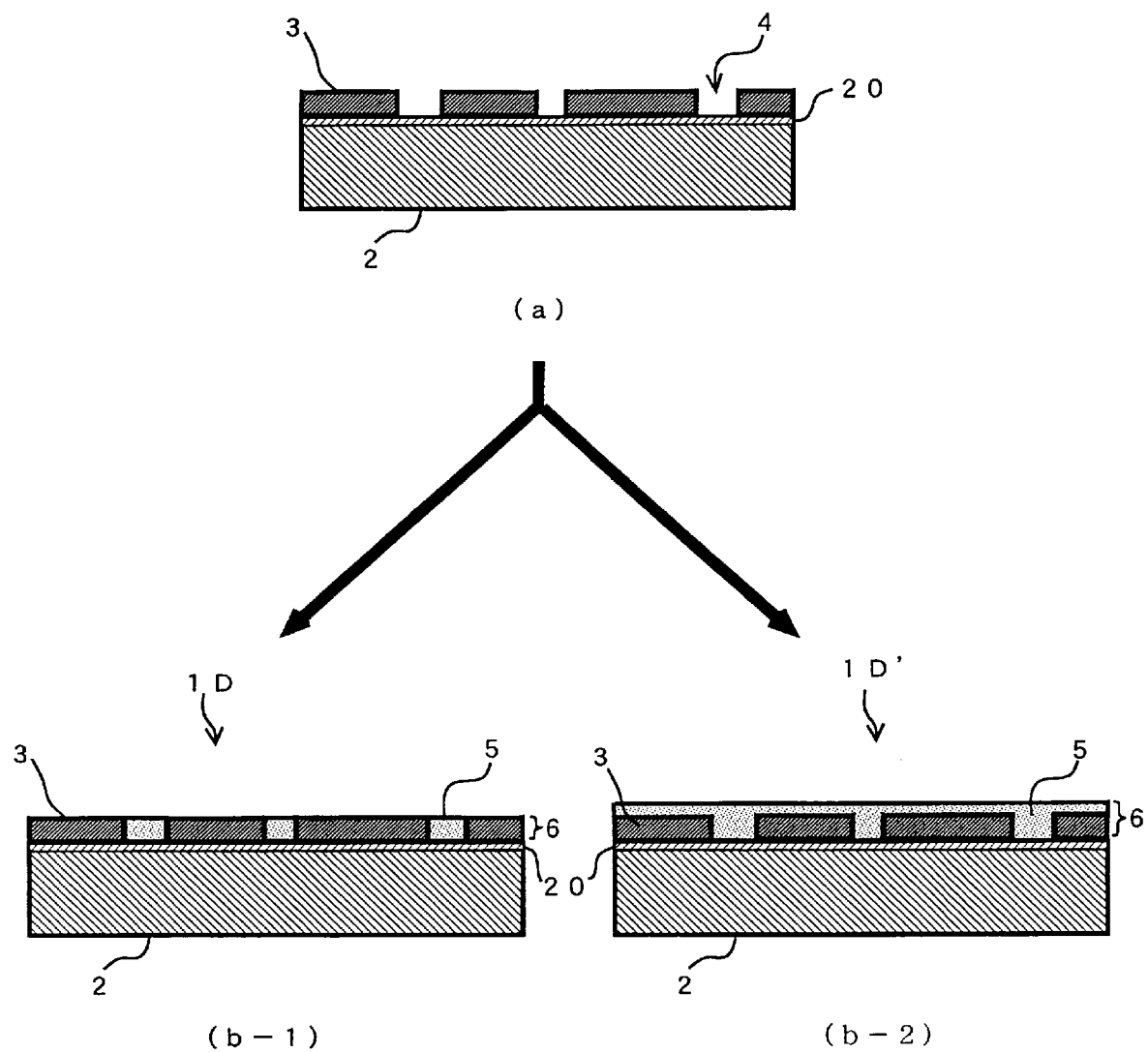

Copper foil provided with high-melting-point metal layer: Moreover, it is very advantageous to form a high-melting-point metal layer 20 on the contact face with the dielectric layer 6 of the copper foil 2. FIGS. 4(a), 4(b-1), and 4(b-2) show schematic sectional views of a dielectric-layer-provided copper foil when the high-melting-point metal layer 20 is used. The high-melting-point metal layer prevents the contact with polyimide resin used for sealing to be described below, functions as a barrier for preventing copper from diffusing in polyimide resin, and improve the migration-resistant performance. To constitute the high-melting point metal layer 20, it is possible to use any one of nickel, chromium, molybdenum, platinum, titanium, and tungsten or an alloy of these metals.

It is enough that the high-melting-point metal layer 20 functions as a barrier for preventing thermal diffusion of copper and the minimum thickness of the layer 20 is used for a thickness for performing a barrier function but the thickness is not restricted. However, when the layer 20 has a thickness of 20 nm or more, a purposed effect may be obtained. Moreover, when the high-melting-point metal layer 20 becomes too thick, the load by etching increases. Therefore, it is preferable to use a thickness of 30 nm or less because it is preferable to minimize the thickness. In this case, components used to constitute the high-melting-point metal layer and the above binder metal layer are similar but thicknesses and purposed functions are different. That is, the binder metal layer may function as an intermediate layer for improving the barrier characteristic and adhesiveness but the high-melting-point metal layer functions as only a barrier layer.

Figure 5:
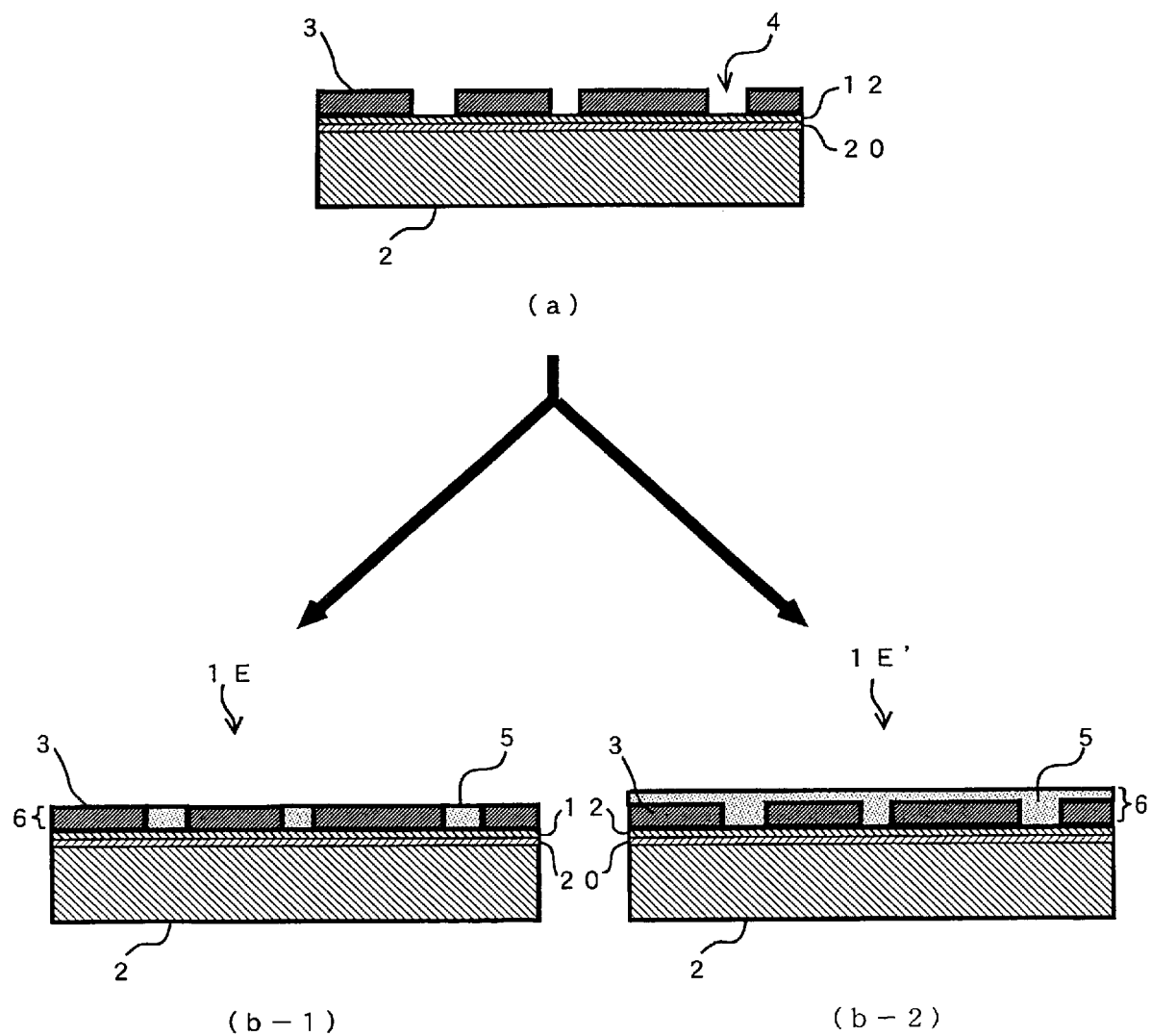

Copper foil provided with high-melting-point metal layer and binder metal layer: Functions of a high-melting-point metal layer and a binder metal layer are described above. Therefore, as shown in FIGS. 5(a), 5(b-1), and 5(b-2), it is possible to use a copper foil simultaneously provided with a high-melting-point metal layer and a binder metal layer. In this case, it is a principle to use a component for constituting the high-melting-point metal layer different from a component for constituting the binder metal layer. Moreover, when the barrier function of the binder metal layer is not sufficient, it can be said that the high-melting-point meta layer becomes necessary.

<Component for Constituting Dielectric Layer>

It is preferable to use any one of or two or more of aluminum oxide, tantalum oxide, and barium titanate for the inorganic-oxide sputter film 3 for constituting a dielectric layer. The inorganic-oxide sputter film 3 is not restricted when using a metal oxide usable as a dielectric. However, when using the sputtering vapor deposition method and considering the uniformity of film thickness and easiness in handling, it is preferable to form the film 3 by using any one of or two or more of aluminum oxide, tantalum oxide, and barium titanate. Because the inorganic-oxide sputter film 3 constitutes the dielectric layer 6, the thickness of the inorganic sputter film 3 influences the thickness of the dielectric layer 6 and decides the final capacitor electric capacity. Therefore, it is preferable that the thickness is as small as possible. In fact, however, it is necessary to set the thickness to 1 μm or more. Otherwise, the number of pit-like defective portions 4 of the inorganic-oxide sputter film 3 is greatly increased and it cannot be said that the uniformity of a film thickness is preferable. Moreover, it is allowed to optionally decide vacuum degree, target layout, type of sputtering ion, and presence or absence of cleaning sputtering which are conditions used for the sputtering vapor deposition method used here by considering the characteristic of an apparatus and these conditions are not matters to be restricted.

Moreover, the thickness of the inorganic-oxide sputter film 3 purposes a 1.0 μm or less. In the case of an inorganic-oxide sputter film having a thickness of 1.0 μm or less, the pit-like defective portion 4 easily occurs. That is, when the thickness exceeds 1.0 μm, the pit-like defective portion 4 at a level requiring sealing by a polyimide resin does not easily occur.

Furthermore, polyimide resin used for sealing of the pit-like defective portion 4 may be constituted by only a polyimide resin component or polyimide resin obtained by dispersing dielectric fillers in the polyimide resin component. By containing dielectric fillers, it is possible to raise the dielectric constant of the dielectric layer 6 and increase the electric capacity of a capacitor. The dielectric filler is described in detail in the following manufacturing method.

<Variation of Dielectric-layer-provided Copper Foil>

Variation I: A dielectric-layer-provided copper foil is manufactured when using a general copper foil and is a dielectric-layer-provided copper foil in which a dielectric layer is used so as to directly contact with the surface of a copper foil. Dielectric-layer-provided copper foils 1A and 1A' respectively constituted by two layers such as a copper foil layer and a dielectric layer shown in FIG. 1 are used.

Variation II: A dielectric-layer-provided copper foil constituted by forming a binder metal layer on the surface of a copper foil and forming a dielectric layer on the surface of the binder metal layer is used. Dielectric-layer-provided copper foils 1C and 1C' shown in FIG. 3 are used which are respectively constituted by three layers consisting essentially of a copper foil layer, a binder metal layer, and a dielectric layer.

Variation III: A dielectric-layer-provided copper foil is used in which a high-melting-point metal layer is formed on the surface of a copper foil and a dielectric layer is formed on the surface of the high-melting-point metal layer. Dielectric-layer-provided copper foils 1D and 1D' shown in FIG. 4 are used which are respectively constituted by three layers consisting essentially of a copper foil layer, a high-melting-point metal layer, and a dielectric layer.

Variation IV: A dielectric-layer-provided copper foil is used in which a high-melting-point metal layer and a binder metal layer are formed on the surface of a copper foil and a dielectric layer is formed on the surface of the binder metal layer. Dielectric-layer-provided copper foils 1E and 1E' shown in FIG. 5 are used which are respectively constituted by four layers consisting essentially of a copper foil layer, a high-melting-point metal layer, a binder metal layer, and a dielectric layer.

Figure 2:
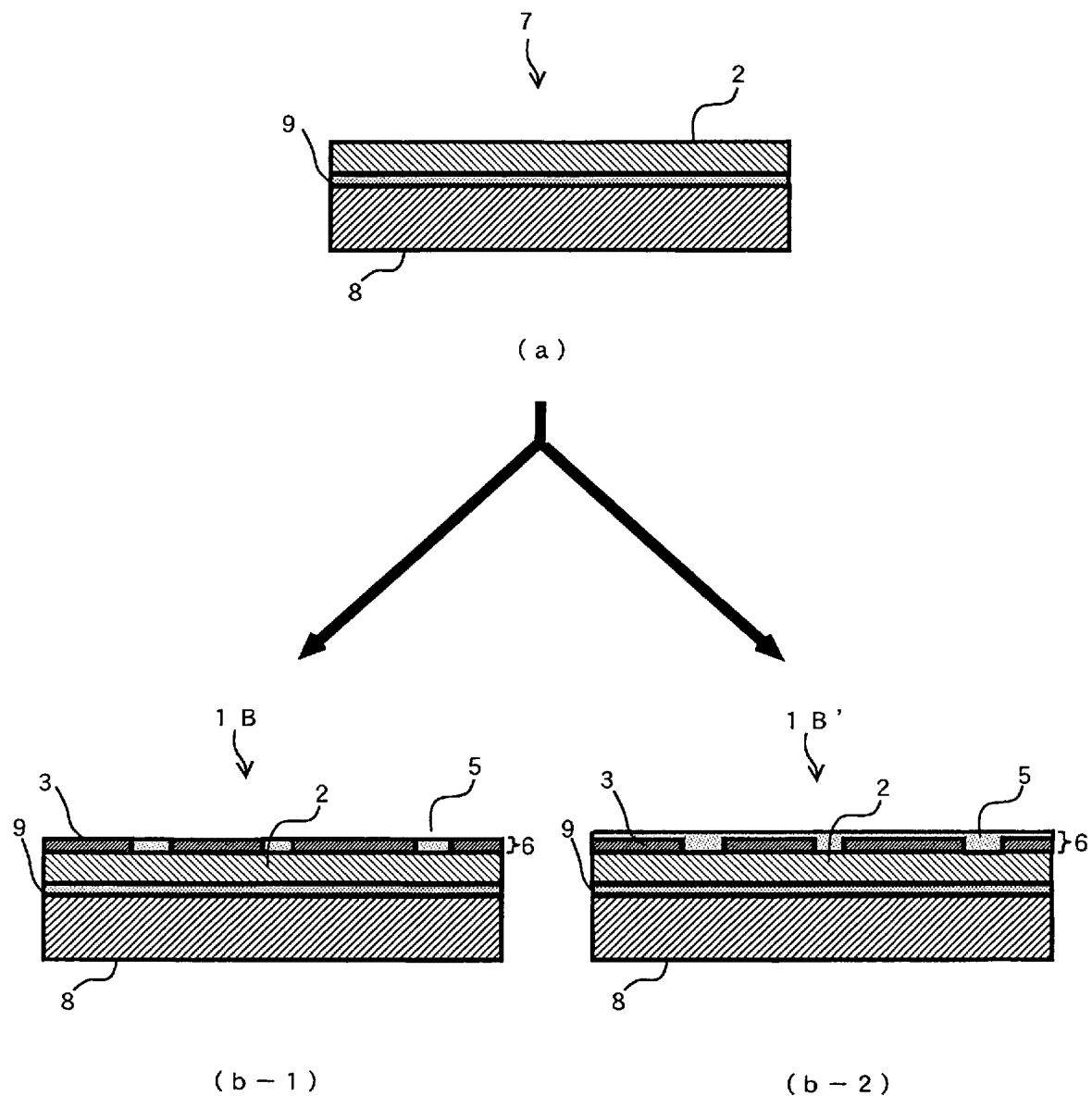

Variation V: Dielectric-layer-provided copper foils 1B and 1B' shown in FIG. 2 are used in which a dielectric layer is respectively formed on the surface of a carrier-foil-provided copper foil by using the carrier-foil-provided copper foil instead of the above copper foil. Though each dielectric-layer-provided copper foil is provided with a carrier foil, it is also possible to form the high-melting-point metal layer 20 or binder metal layer 12 between the copper foil layer 2 and the dielectric layer 6 and adopt various variations shown in FIG. 6.

B. Dielectric-layer-provided Copper Foil Manufacturing Method

A dielectric-layer-provided copper foil manufacturing method of the present invention basically employs the following steps I. and II. That is, I. An inorganic-oxide sputter film having a thickness of 1.0 μm or less is formed on one side of a copper foil by using the sputtering vapor deposition method. II. Then, a pit-like defective portion generated on the inorganic-oxide sputter film is embedded and sealed by using the electrodeposition method of polyimide resin.

Manufacturing method relating to copper foil: For the copper foil used here is not followed by restriction of a manufacturing method or presence or absence of roughing like the above mentioned. However, when using the dielectric-layer-provided copper foils 1C and 1C' respectively provided with the binder metal layer 12 shown in FIG. 3, the dielectric-layer-provided copper foils 1D and 1D' respectively provided with the high-melting-point metal layer 20 shown in FIG. 4, or the dielectric-layer-provided copper foils 1E and 1E' respectively provided with the high-melting-point metal layer 20 and the binder metal layer 12 shown in FIG. 5, it is necessary to form a high-melting-point metal layer or binder metal layer on the surface of a copper foil at this stage. To form the high-melting-point metal layer or binder metal layer, it is possible to use any one of the wet electrolytic method and non-electrolytic method, dry vapor deposition, sputtering, ion plating, and CVD in accordance with a component. A film having a uniform thickness is formed on the surface of a copper foil by optionally selecting any one of the above thin film forming methods. In the case of the above thin film forming methods, it is not necessary to consider a manufacturing condition and description of each thin film forming method is unnecessary.

Forming method of inorganic-oxide sputter film for constituting dielectric layer: Then, for the sputtering vapor deposition method when forming an inorganic-oxide sputter film on the surface of a copper foil, it is allowed to execute the method by adjusting conditions in accordance with the rule. Therefore, description may be unnecessary. Therefore, the electrodeposition method of polyimide resin is described below. In the case of the electrodeposition method of polyimide resin, it is possible to securely embed (seal) the pit-like defective portion of an inorganic-oxide sputter film in a complex and minute concave shape and moreover, the electrodeposited film of polyimide resin becomes a uniform film free from a defect such as a pinhole.

Polyimide resin used for sealing and the sealing method: In the case of the present invention, it is preferable to use the electrodeposited polyimide method for sealing. Because the polyimide resin used for the electrodeposited polyimide method is hardly dissolved in a solvent, a polyimide film is formed by electrodepositing the state of polyamide acid which is an anterior of the polyimide resin, heating it at a high temperature, and thereby dehydrating and ring-forming it. However, the polyimide acid has a disadvantage that it is easily decomposed and unstable. Therefore, in the case of the present invention, it is preferable to form a polyimide film by using polyimide electrodeposited solution for an anion electrodepositing composition using a multiblock polyimide soluble in a solvent containing a pendant carboxyl group. Therefore, it is possible to obtain the polyimide electrodeposited solution of this type in a market and there are some commercial polyimide electrodeposited solutions having very superior performances.

To form a polyimide film on an inorganic-oxide sputter film by using the polyimide electrodeposited solution, the electrodeposition characteristic depends on the type of the inorganic-oxide sputter film. Therefore, it is necessary to adjust a polyimide electrodeposited solution depending on the type of an inorganic-oxide sputter film serving as an object to be covered for forming a polyimide film. Generally, to form a polyimide film on an inorganic-oxide sputter film in accordance with the electrodeposition method, when only embedding the pit-like defective portion of an inorganic-oxide sputter film as shown in FIG. 1(b-1), it is considered that a smaller particle diameter of a colloid particle is more superior in embedding performance of multiblock polyimide in a polyimide electrodeposited solution and it is necessary to decrease the colloid particle in diameter by increasing the quantity of a solvent. However, as shown in FIG. 1(b-2), when embedding the pit-like defective portion of an inorganic-oxide sputter film and forming a uniform film, it is necessary to simultaneously achieve the action of embedding and the action of uniform film formation. Therefore, the particle diameter of colloid particle of multiblock polyimide in a polyimide electrodeposited solution must have a proper value. Moreover, an intimate relation with a particle diameter of a colloid particle of multiblock polyimide and a film thickness which can be realized is present. Therefore, when manufacturing the dielectric-layer-provided copper foils 1A', 1B', 1C', 1D', and 1E' shown in FIG. 1(b-2) by considering these things, it is necessary to adjust the diameter of a colloid particle in a polyimide electrodeposited solution to a proper range capable of keeping the balance with the polyimide film thickness, uniform electrodeposition characteristic, and embedding characteristic.

Then, the polyimide resin electrodeposition method can also use a dielectric-filler-containing polyimide electrodeposited solution obtained by containing dielectric fillers in a polyimide electrodeposited solution. In the case of the dielectric-layer-provided copper foils 1A, 1B, 1C, 1D, and 1E shown in FIG. 1(b-1), it is not always necessary that a dielectric filler is present on a pit-like defective portion. The method is particularly effective for the dielectric-layer-provided copper foils 1A', 1B', 1C', 1D', and 1E' shown in FIG. 1(b-2), FIG. 2(b-2), and FIG. 3(b-2).

Dielectric filler contained in polyimide resin: Dielectric fillers used in this case "have an average particle diameter $D_{IA}$ of 0.05 to 1.0 μm, an accumulated particle diameter $D_{50}$ by the laser-diffraction-scattering particle-size-distribution measuring method ranges between 0.1 and 2.0 μm, and it is preferable to use dielectric powder having a perovskite structure of a substantially spherical shape in which a cohesion degree shown by $D_{50}/D_{IA}$ by using the accumulated particle diameter $D_{50}$ and the average particle diameter $D_{IA}$ obtained from an image analysis is 4.5 or less."

Originally, in the case of the present invention, it can be said that the composition of the polyimide electrolytic solution should be decided by considering up to the dispersing property of dielectric fillers to be dispersed in the polyimide electrolytic solution. However, the number of types of polyimide electrodeposited solutions containing multiblock polyimide capable of forming a uniform polyimide film free from defect at the present technical level is limited and the adjustment range of the compositions is limited.

Therefore, the present inventors et al. secured a preferable dispersing property of dielectric fillers into a polyimide electrodeposited solution by improving the powder aspect of dielectric fillers. Dielectric fillers used for the present invention are made present by dispersing them in a dielectric-filler-containing polyimide film, finally function as the dielectric layer of a capacitor, and are used to increase the electric capacity of a capacitor when they are formed into a capacitor shape. The dielectric filler uses dielectric powder of composite oxide having a perovskite structure such as $BaTiO_3$, $SrTiO_3$, $Pb(Zr—Ti)O_3$ (common name of PZT), $PbLaTiO_3.PbLaZro$ (common name of PLZT), or $SrBi_2T_2O_9$ (common name of SBT).

Moreover, in the case of the powder characteristic of the dielectric fillers, the particle diameter must range between 0.05 and 1.0 μm. The particle diameter in this case, particles form a constant secondary cohesion state. Therefore, it is impossible to use the laser-diffraction-scattering particle-size-distribution measuring method or BET method because the accuracy is deteriorated by the indirect measurement of measuring an average particle diameter from the measured value by the laser-diffraction-scattering particle-size-distribution measuring method or BET method. The particle diameter in this description is an average particle diameter obtained by directly observing a dielectric filler by a scanning electron microscope (SEM) and image-analyzing the SEM image. In this description, the particle diameter in this case is shown as "$D_{IA}$". In the case of the image analysis of dielectric filler powder observed by using the scanning electron microscope (SEM) in this description, the average particle diameter $D_{IA}$ is obtained by using the model IP-1000PC made by ASAHI ENGINEERING CO., LTD. and assuming the circle-degree threshold value as 10 and the overlap degree as 20.

Moreover, it is requested that the dielectric powder is used which has a perovskite structure having a substantially spherical shape in which the accumulated particle diameter $D_{50}$ measured by the laser-diffraction-scattering particle-size-distribution measuring method ranges between 0.1 and 2.0 μm and the cohesion degree shown by $D_{50}/D_{IA}$ by using the accumulated particle diameter $D_{50}$ and average particle diameter $D_{IA}$ obtained through image analysis is 4.5 or less.

The accumulated particle diameter $D_{50}$ measured by the laser-diffraction-scattering particle-size-distribution measuring method denotes a particle diameter at an accumulation of 50% obtained by using the laser-diffraction-scattering particle-size-distribution measuring method and as the accumulated particle diameter $D_{50}$ decreases, the rate of particulate in the particle diameter distribution of dielectric filler powder increases. In the case of the present invention, it is requested that the value of the rate ranges between 0.1 and 2.0 μm. That is, when the value of the accumulated particle diameter $D_{50}$ is less than 0.1 μm, progress of cohesion is extreme for dielectric filler powder obtained through any manufacturing method and the cohesion degreed described below is not satisfied. However, when the value of the accumulated particle diameter $D_{50}$ exceeds 1.0 μm, it is impossible to use the dielectric filler for forming a built-in capacitor layer of a printed wiring board purposed by the present invention. That is, a dielectric layer of a both-side copper clad laminate used to form a built-in capacitor layer normally has a thickness of 10 to 25 μm. Therefore, to uniformly disperse dielectric fillers, 2.0 μm-thickness becomes an upper limit.

The accumulated particle diameter $D_{50}$ in the present invention is measured by dispersing dielectric filler powder in methyl ethyl ketone and putting the solution in the circulator of a laser-diffraction-scattering particle-size-distribution measuring apparatus, Micro Trac HRA 9320-X100 type (made by NIKKISO CO., LTD.).

In this case, the concept of cohesion degree is used, which is adopted from the following reason. That is, it is considered that the value of the accumulated particle diameter $D_{50}$ obtained by using the laser-diffraction-scattering particle-size-distribution measuring method is not obtained by directly observing diameters of particulates one by one. Particulates constituting most dielectric powder are not the so-called single dispersion powder in which individual particles are completely separated but several particles cohere and group. The laser-diffraction-scattering particle-size-distribution measuring method captures coherent particulates as one particle (coherent particle) and calculates an accumulated particle diameter.

However, the average particle diameter $D_{IA}$ obtained by image-processing an observed image of dielectric powder observed by using a scanning electron microscope is directly obtained from an SEM observation image. Therefore, primary particles are securely captured but present of the coherent state of particulates is not reflected at all.

When considering the above mentioned, the present inventors et al. capture the value calculated with $D_{50}/D_{IA}$ as a cohesion degree by using the accumulated particle diameter $D_{50}$ obtained from the laser-diffraction-scattering particle-size-distribution measuring method and the average particle diameter $D_{IA}$ obtained from image analysis. That is, when considering the above-describe theory by assuming that values of $D_{50}$ and $D_{IA}$ can be measured at the same accuracy in copper powder of the same lot, it is considered that the value of $D_{50}$ for reflecting a coherent state on a measured value is larger than the value of $D_{IA}$ (the same result is obtained from real measurement).

In this case, the value of $D_{50}$ boundlessly approaches to the value of $D_{IA}$ when the coherent state of particulates of dielectric fillers completely disappears and the value of $D_{50}/D_{IA}$ which is a cohesion degree approaches to 1. When the cohesion degree becomes 1, single dispersion powder completely free from the coherent state of particulates is obtained. In fact, however, there is a case in which a cohesion degree shows a value of less than 1. In the case of a complete sphere theoretically thought, the cohesion degree does not become a value less than 1. In fact, however, because a particulate is not a complete sphere, a cohesion degree of less than 1 is requested.

In the case of the present invention, it is requested that the cohesion degree of the dielectric filler powder is 4.5 or less. When the cohesion degree exceeds 4.5, the coherent level between particulates of the dielectric filler becomes too high and uniform mixing with the above polyimide electrodeposited solution becomes difficult.

Even if adopting as a method for production of dielectric filler any one of the alcoxide method, hydrothermal synthesis method, and oxalate method, a dielectric filler not satisfying the above cohesion degree is produced because a constant coherent state is inevitably formed. Therefore, dielectric filler powder not satisfying the above cohesion degree is produced. Particularly, in the case of the hydrothermal synthesis method which is a wet method, formation of a coherent state tends to easily occur. Therefore, by performing the particle separation processing for separating the coherent powder into particulates one by one, it is possible to keep the coherent state of dielectric filler powder in the above cohesion degree range.

When simply purposing to perform particle separation work, it is possible to use any one of the high-energy ball mill, high-speed conductor-collision air-flow-type crusher, collision crusher, gauge mill, medium agitation mill, and high-water-pressure crusher. However, to secure the mixing property and dispersing property of dielectric filler powder and polyimide electrodeposited solution, it should be considered to reduce the viscosity of the dielectric-filler-containing polyimide electrodeposited solution described below. To reduce the viscosity of the dielectric-filler-containing polyimide electrodeposited solution, it is requested to decrease the specific surface area of a dielectric filler particulate and smooth the particulate. Therefore, even if particle separation can be made, a particle separation method should not be used which damages the surface of a particulate at the time of particle separation and increases the specific surface area.

As a result that the present inventors et al. studied with all their hearts in accordance with the above recognition, it was found that two methods were effective. A point common to these two methods is in that each of the two methods is a method capable of sufficiently performing particle separation by minimizing the contact of particulates of dielectric filler powder with the inner wall, agitation blade, or crushing medium of an apparatus and making coherent particulates collide with each other. That is, contact with portions of the inner wall, agitation blade, or crushing medium of the apparatus results in damaging the surface of a particulate, increasing the surface roughness, or deteriorating the sphericity and this is prevented. Moreover, by causing sufficient mutual collision of particulates, coherent-state particulates are separated from each other and at the same time, it is possible to adopt techniques capable of smoothing the particulate surface by the mutual collision of particulates.

One of the techniques is to separate coherent-state dielectric filler powder by using a jet mill. The "jet mill" in this case performs particle separation by using a high-speed air flow, thereby putting dielectric filler powder into the air flow, making particulates collide with each other in the high-speed air flow, and performing particle separation.

Moreover, slurry of the coherent-state dielectric filler powder dispersed in the solvent which does not break the stoichiometry of the slurry is separated by using a fluid mill using centrifugal force. In this case, by using the "fluid mill using centrifugal force," the slurry is flown at a high speed so as to draw a circular trajectory and particulates cohering by the centrifugal force generated in this case are made to collide with each other to perform particle separation. Thus, by cleaning, filtering, and drying the slurry completing particle separation, the dielectric filler powder completing particle separation can be obtained. By using the above-described method, it is possible to adjust the cohesion degree and smooth the surface of the dielectric filler powder.

Moreover, to disperse particulates of dielectric fillers, it is preferable to use a high-speed-rotation thin film method which is one type of wet dispersing units. The high-speed-rotation thin film method is briefly described below. An apparatus used for the above method is an agitator including an agitating blade having the diameter almost equal to the diameter of the inner wall of a cylindrical agitating bath inside. A cyclon flow is generated by injecting material slurry ("solvent in which dielectric fillers are dispersed" in the case of the present invention) into the bottom of the agitating bath and rotating the agitating blade at a high speed, the material slurry starts rotation and forms a rotation thin film along the inner wall of the agitating bath. The rotation thin film is pressed against the inner wall of a vessel by receiving a large force at an acceleration due to centrifugal force and thereby, dielectric filler particulates roll in the inner wall surface of the vessel, and dispersion processing can be made so as to be removed from the surface of coherent particles. In this case, the particulates do not collide with the inner wall surface but the particulates contact with the inner wall surface while rolling. Therefore, particulate surface is not easily damaged or the specific surface area of particulates is not increased, and the surface smoothing effect of the particulates can be rather expected.

By using the high-speed rotation thin film method, the dispersion effect for eliminating the coherent state of particles of dielectric fillers and the effect for sharpening the particle size distribution of the dielectric fillers can be obtained and the re-cohesion which is frequently observed when adopting the normal agitation dispersion method does not easily occur. Thus, it is possible to improve the dispersion property of dielectric fillers.

The polyimide electrodeposited solution is mixed with the dielectric fillers described above to prepare a dielectric-filler-containing polyimide electrodeposited solution. In the case of the blending ratio between the polyimide electrodeposited solution and the dielectric fillers, it is preferable that the content of the dielectric fillers in the dielectric-filler-containing polyimide electrodeposited solution ranges between 75 and 90 wt %.

When the content of the dielectric fillers is less than 75 wt %, it is impossible to obtain the dielectric-constant improvement effect when constituting a capacitor. When the content of the dielectric fillers exceeds 90 wt %, the content of polyimide resin in a polyimide film containing the dielectric fillers to be formed (hereafter referred to as "dielectric-filler-containing polyimide film") becomes too low, the dielectric-filler-containing polyimide film becomes fragile, and the strength of a dielectric layer is lowered.

Moreover, as the dielectric filler, it is preferable to use barium titanate among composite oxides respectively having a perovskite structure when considering the manufacturing accuracy of powder at this stage. In this case, it is possible to use temporary burned barium titanate or unburned barium titanate for the dielectric filler. To obtain a high dielectric constant, it is preferable to use temporary burned barium titanate. However, it is allowed to selectively use either of them in accordance with the design quality of a capacitor.

Furthermore, it is preferable that the dielectric filler of barium titanate has a cubic crystal structure. The crystal structure of barium titanate includes cubic crystal and tetragonal crystal. When using the dielectric filler of barium titanate having a cubic crystal structure, the value of the dielectric constant of a finally-obtained dielectric layer is stabilized compared to the case of using a dielectric filler of barium titanate having only a tetragonal crystal structure. Therefore, it can be said that it is necessary to use barium titanate powder having both cubic crystal structure and tetragonal crystal structure.

By using the dielectric-filler-containing polyimide electrodeposited solution described above and thereby forming a dielectric-filler-containing polyimide film on the surface of a metal-oxide sputter film through the electrodeposition method, dielectric fillers are uniformly dispersed in the dielectric-filler-containing polyimide film and the dielectric-filler-containing polyimide film has a smooth surface and a uniform film thickness and is free from defect.

C. Copper Clad Laminate for Forming Capacitor Layer

<Basic Configuration of Copper Clad Laminate for Forming Capacitor Layer>

Figure 7:
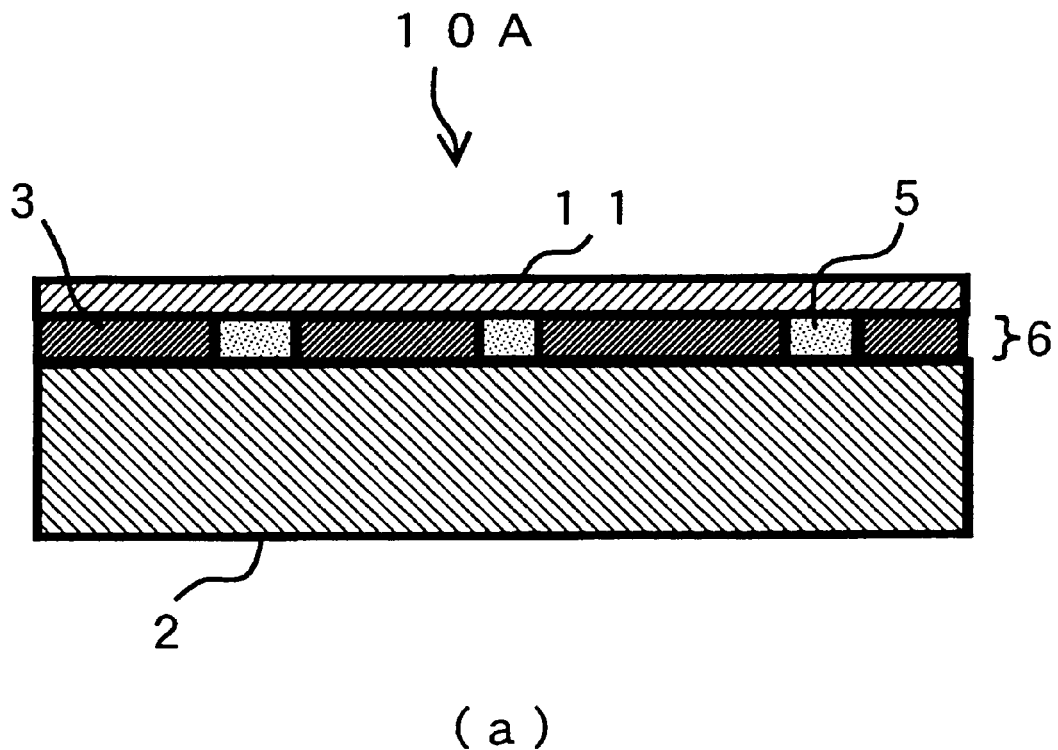
FIGS. 7 to 22 are schematic sectional views showing the variation of copper clad laminates for forming capacity layers obtained by using the copper foils provided with dielectric layers shown in FIGS. 1 to 6.
Figure 7:
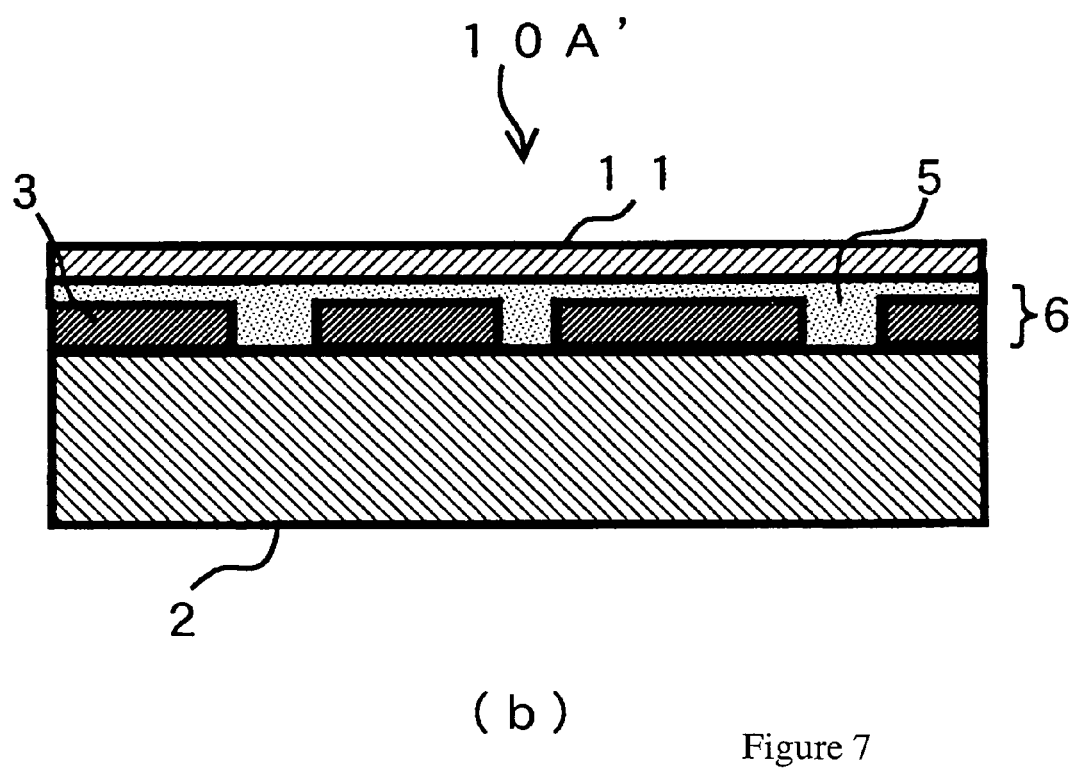

A copper clad laminate of the present invention for forming a capacitor layer is characterized in that it uses the copper foil layer of the above-described dielectric-layer-provided copper foil of the present invention as a lower electrode forming layer and has an upper electrode forming layer on the dielectric layer, uses a configuration of three layers consisting essentially of a lower electrode forming layer, a dielectric layer, and an upper electrode forming layer as a basic configuration. FIG. 7 shows schematic sectional views of copper clad laminates 10A and 10A' respectively having the above basic configuration. In this case, the term "copper clad laminate" is used because a copper layer using a copper foil is present on at least one face and it is not always necessary that the upper electrode forming layer 11 is a layer formed by copper.

It is preferable that the upper electrode forming layer 11 uses any one of components of copper, aluminum, silver, and gold. Though it is considered to use other metallic material, it is preferable in the current status on the basis of the features of FIGS. 1(b-1) and 1(b-2) to use a metallic material superior in adhesiveness with a metal-oxide sputtering layer and polyimide layer for the upper electrode forming layer 11 and copper, aluminum, silver, or gold is preferable as a material coinciding with these requests and superior in electrical characteristics.

In the case of the upper electrode forming layer 11, it is possible to use an electroless plating method or a method for combining copper foils together for copper. However, it is preferable to manufacture the layer 11 in accordance with a dry system by using the sputtering vapor deposition method independently of a metallic material to be used from the viewpoint of keeping the thickness of a dielectric layer uniform.

Moreover, it is possible to form a high-melting-point metal layer and a binder metal layer between the upper electrode forming layer 11 and the dielectric layer 6 as described above for dielectric-layer-provided copper foil. Therefore, a copper clad laminate of the present invention for forming a capacitor layer is provided with the variations described below. The description and function relating to a high-melting-point metal layer and a binder metal layer are the same as the description of the above dielectric-layer-provided copper foil, the description is omitted in order to avoid duplicate description.

<Variation of Copper Clad Laminate for Forming Capacitor Layer>

Variation 1: By using a dielectric-layer-provided copper foil having a dielectric layer so as to directly contact with the surface of a copper foil used as a lower electrode, copper clad laminates 10A and 10A' for respectively forming a capacitor layer having a three layer configuration consisting essentially of a lower electrode forming layer, a dielectric layer, and an upper electrode forming layer are formed as shown in FIG. 7.

Figure 8:
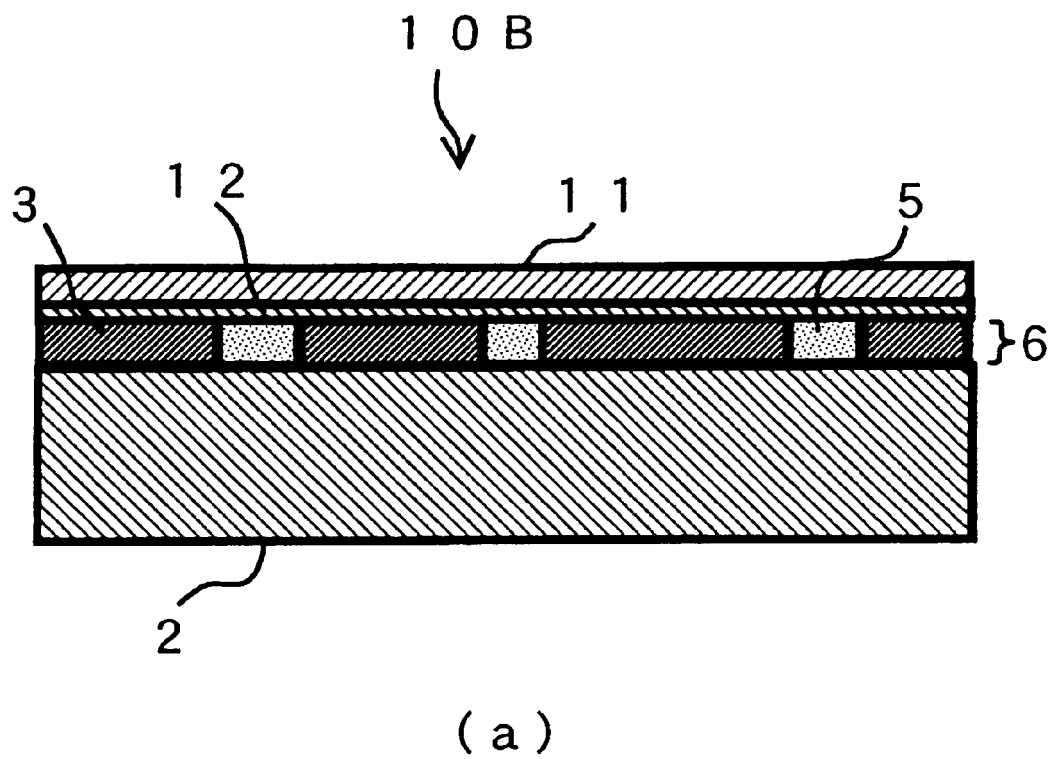
Figure 8:
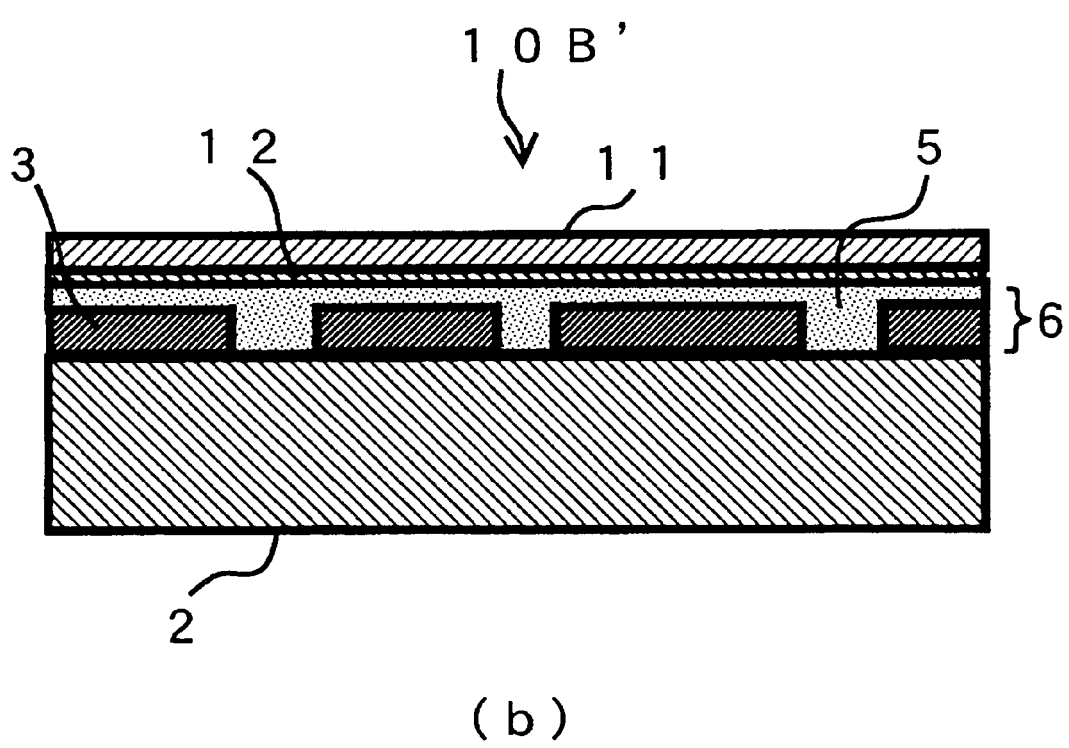

Variation 2: By using a dielectric-layer-provided copper foil having a dielectric layer so as to directly contact with the surface of a copper foil used as a lower electrode, copper clad laminates 10B and 10B' for respectively forming a capacitor layer having a four layer configuration consisting essentially of a lower electrode forming layer, a dielectric layer, a binder metal layer, and an upper electrode forming layer are formed as shown in FIG. 8.

Figure 9:
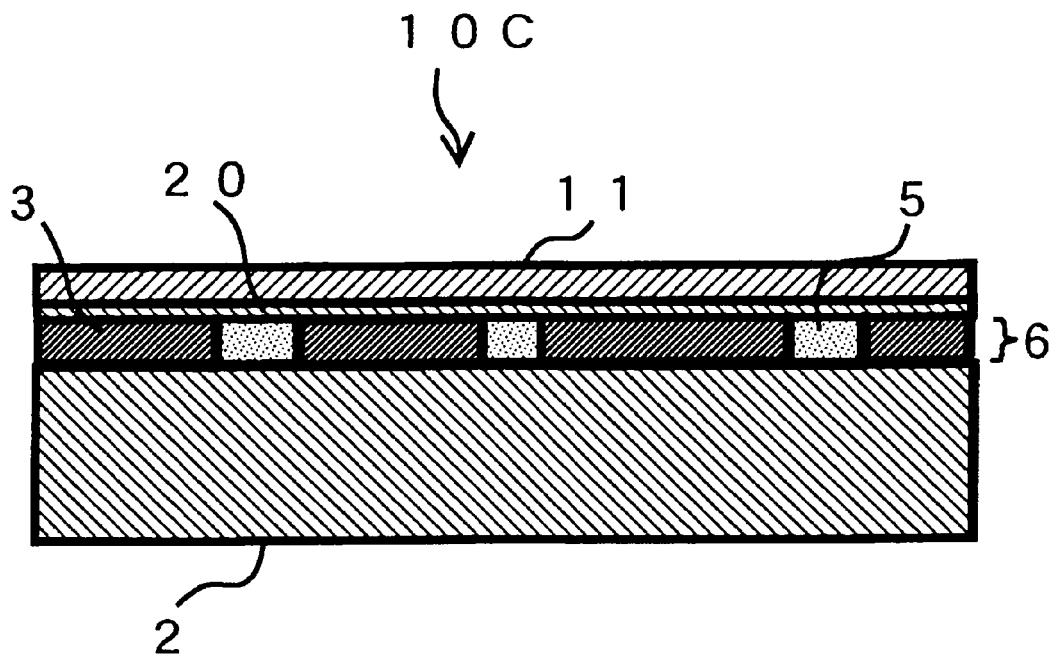
Figure 9:
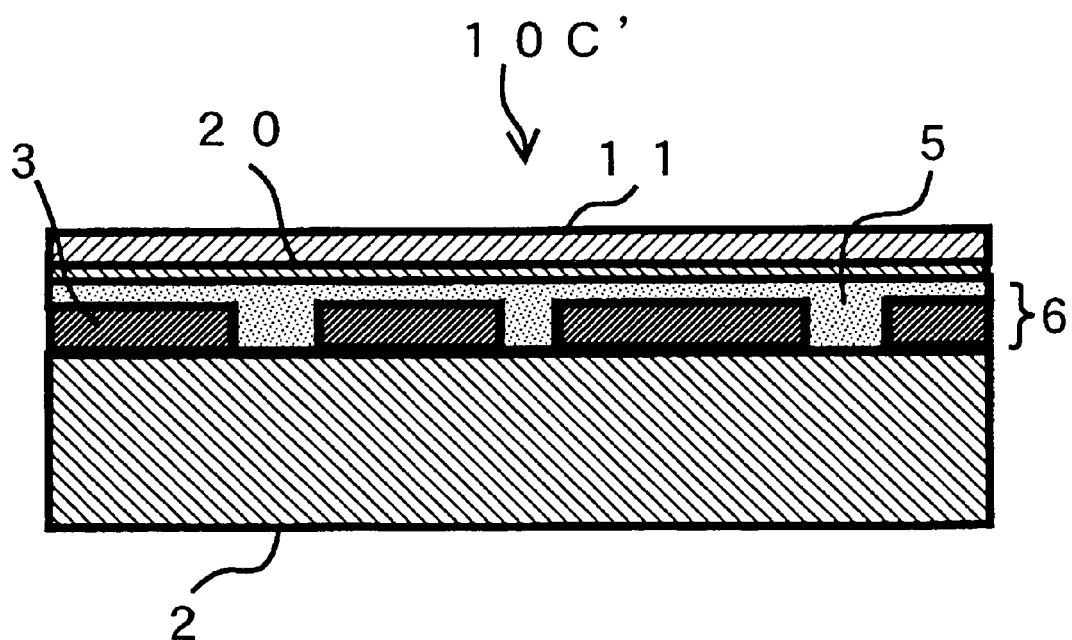

Variation 3: By using a dielectric-layer-provided copper foil having a dielectric layer so as to directly contact with the surface of a copper foil used as a lower electrode, copper clad laminates 10C and 10C' for respectively forming a capacitor layer having a four layer configuration consisting essentially of a lower electrode forming layer, a dielectric layer, a high-melting-point metal layer, and an upper electrode forming layer are formed as shown in FIG. 9.

Figure 10:
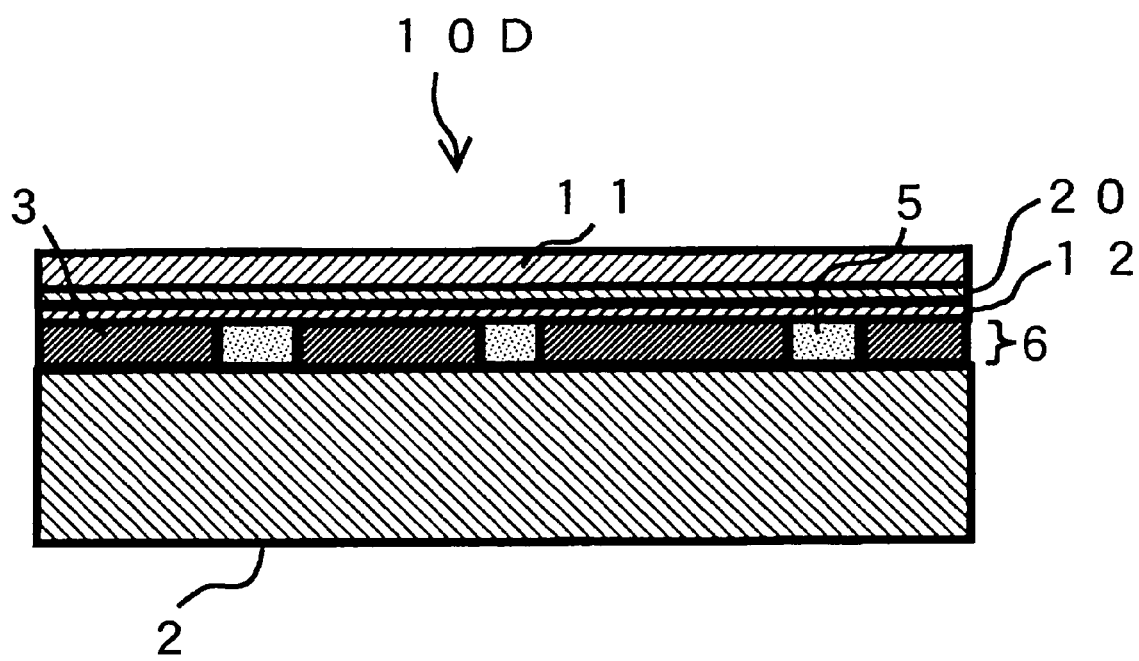
Figure 10:
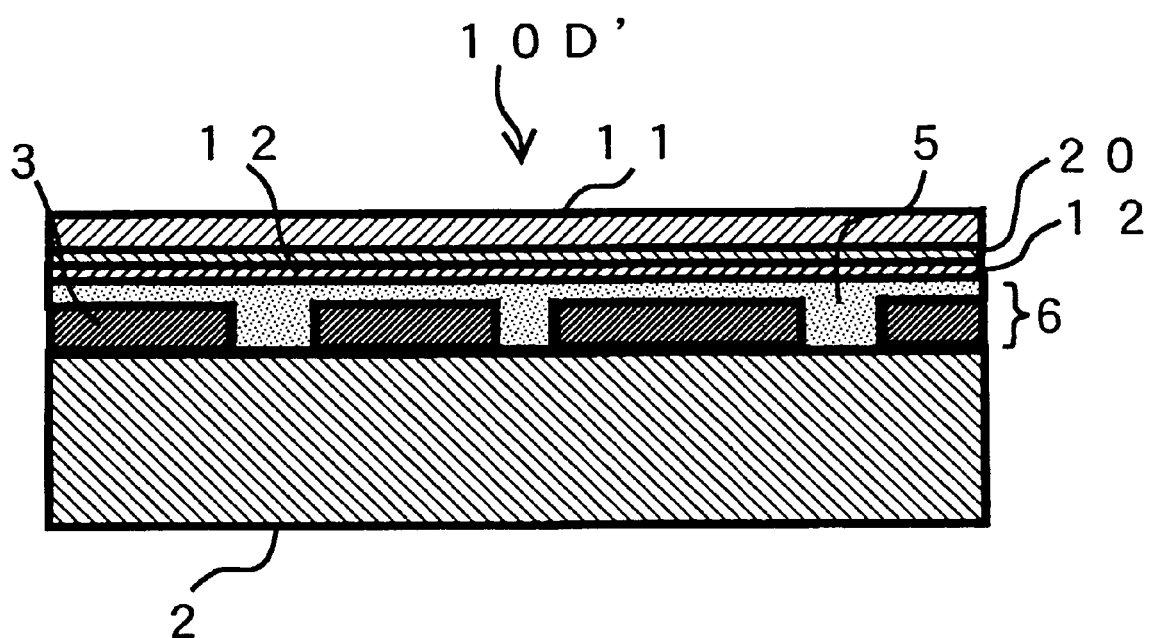

Variation 4: By using a dielectric-layer-provided copper foil having a dielectric layer so as to directly contact with the surface of a copper foil used as a lower electrode, copper clad laminates 10D and 10D' for respectively forming a capacitor layer having a five layer configuration consisting essentially of a lower electrode forming layer, a dielectric layer, a binder metal layer, a high-melting-point metal layer, and an upper electrode forming layer are formed as shown in FIG. 10.

Figure 11:
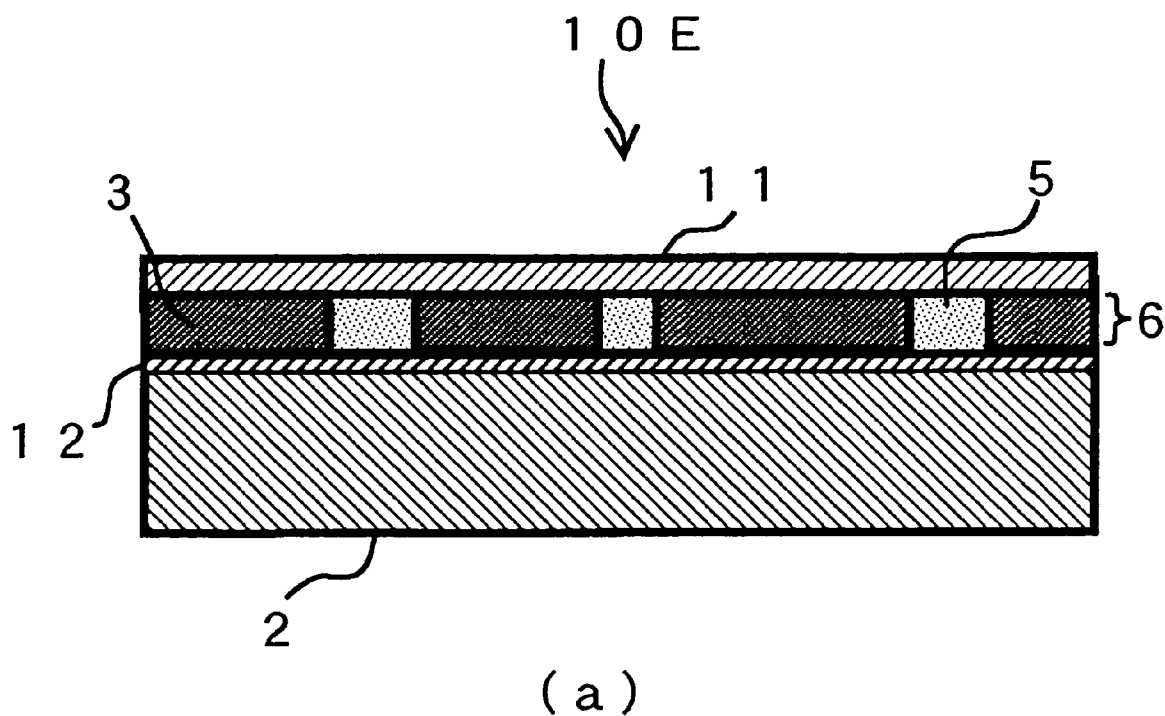
Figure 11:
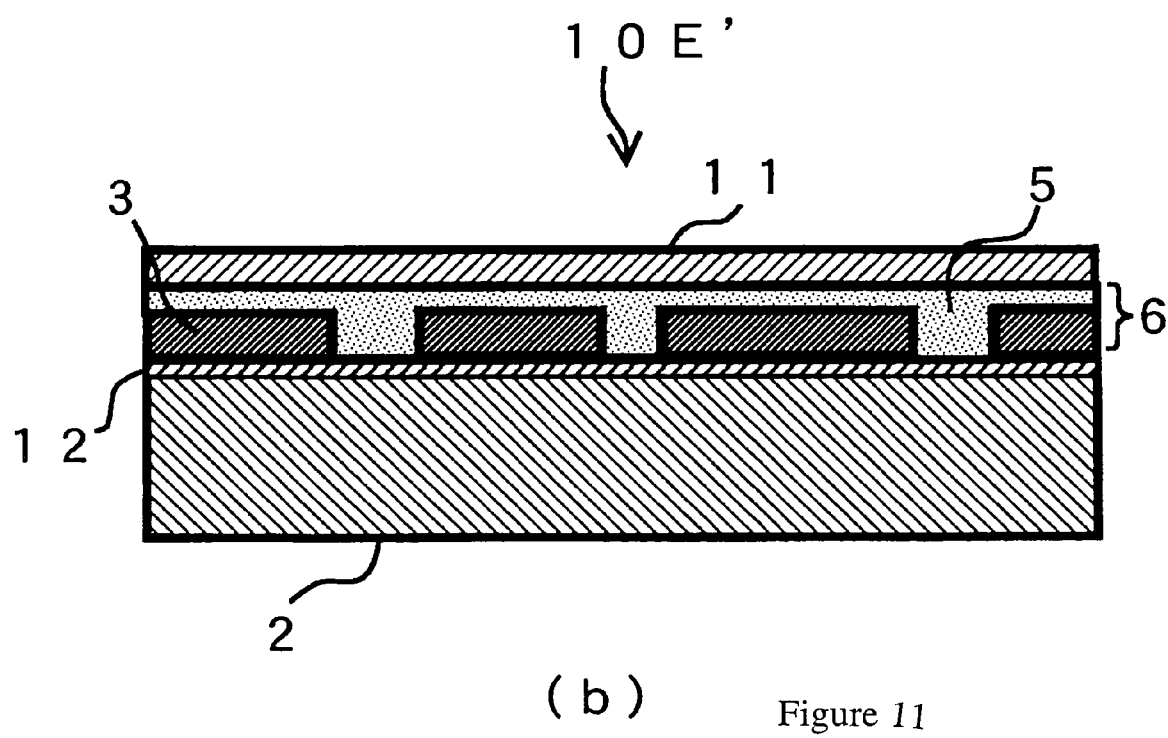

Variation 5: By using a dielectric-layer-provided copper foil having a binder metal layer between a copper foil used as a lower electrode and a dielectric layer, copper clad laminates 10E and 10E' for respectively forming a capacitor layer having a four layer configuration consisting essentially of a lower electrode forming layer, a binder metal layer, a dielectric layer, and an upper electrode forming layer are formed as shown in FIG. 11.

Figure 12:
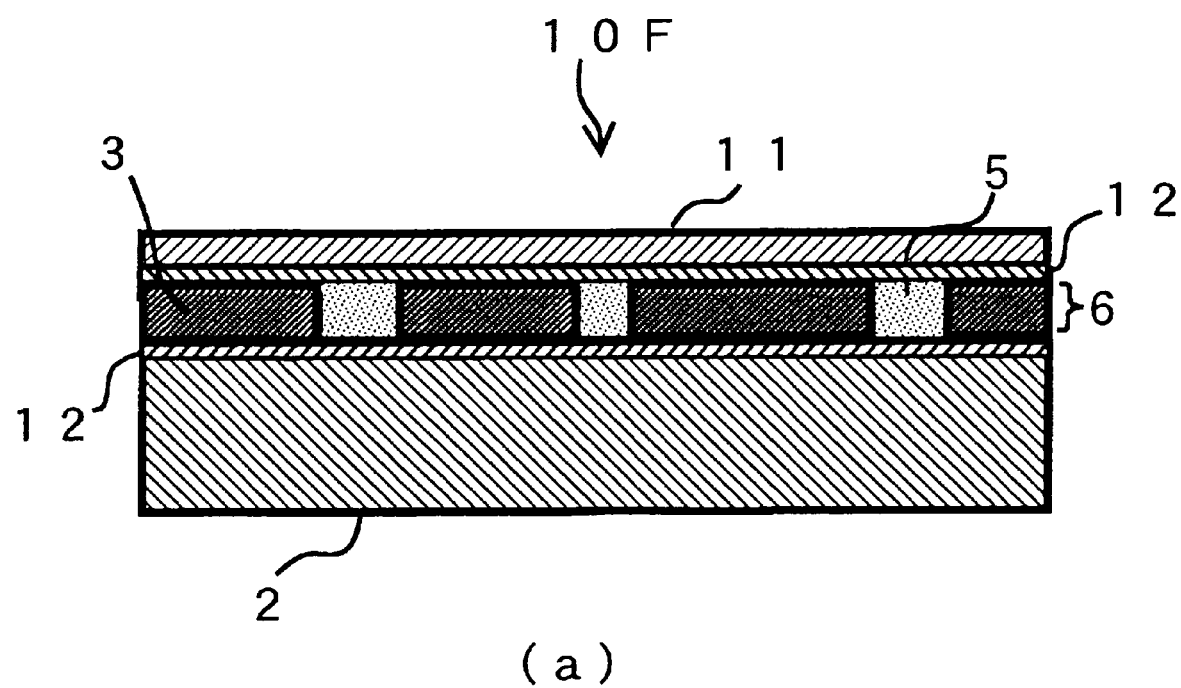
Figure 12:
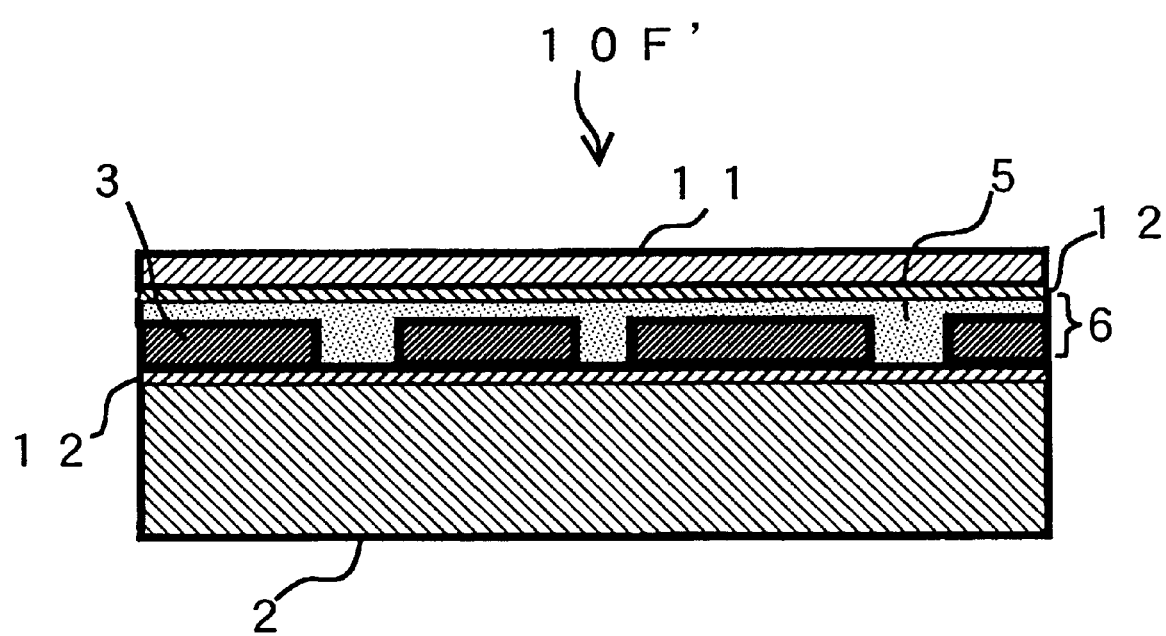

Variation 6: By using a dielectric-layer-provided copper foil having a binder metal layer between a copper foil used as a lower electrode and a dielectric layer, copper clad laminates 10F and 10F' for respectively forming a capacitor layer having a five layer configuration consisting essentially of a lower electrode forming layer, a binder metal layer, dielectric layer, a binder metal layer, and an upper electrode forming layer are formed as shown in FIG. 12.

Figure 13:
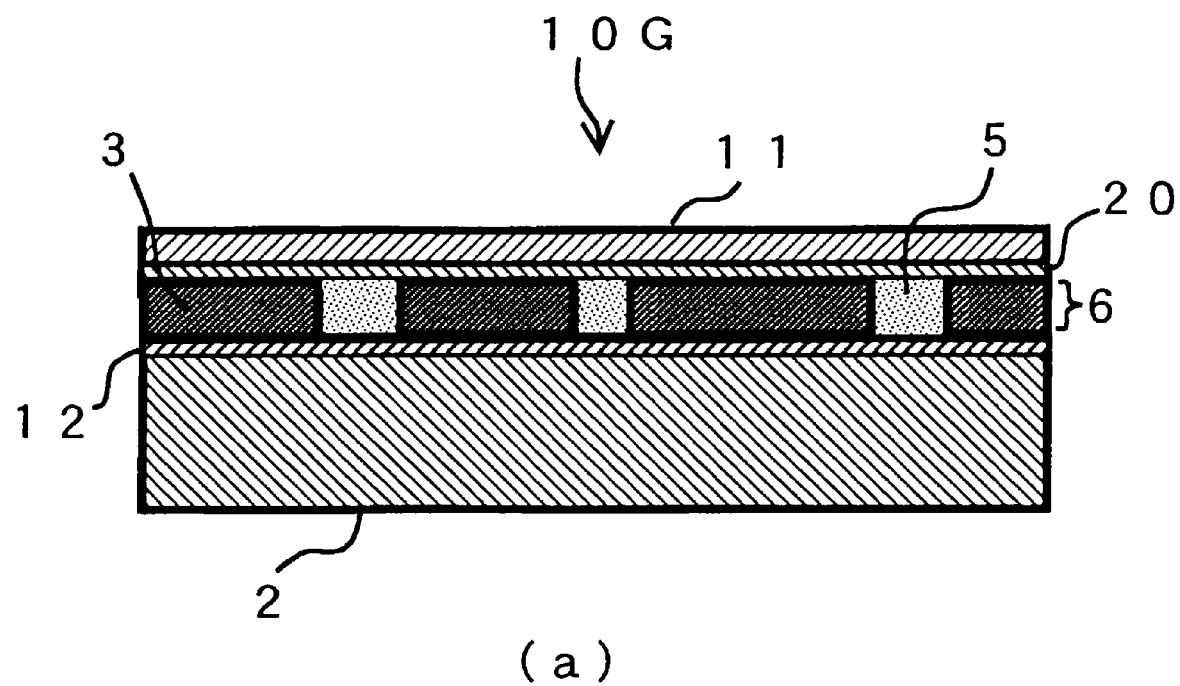
Figure 13:
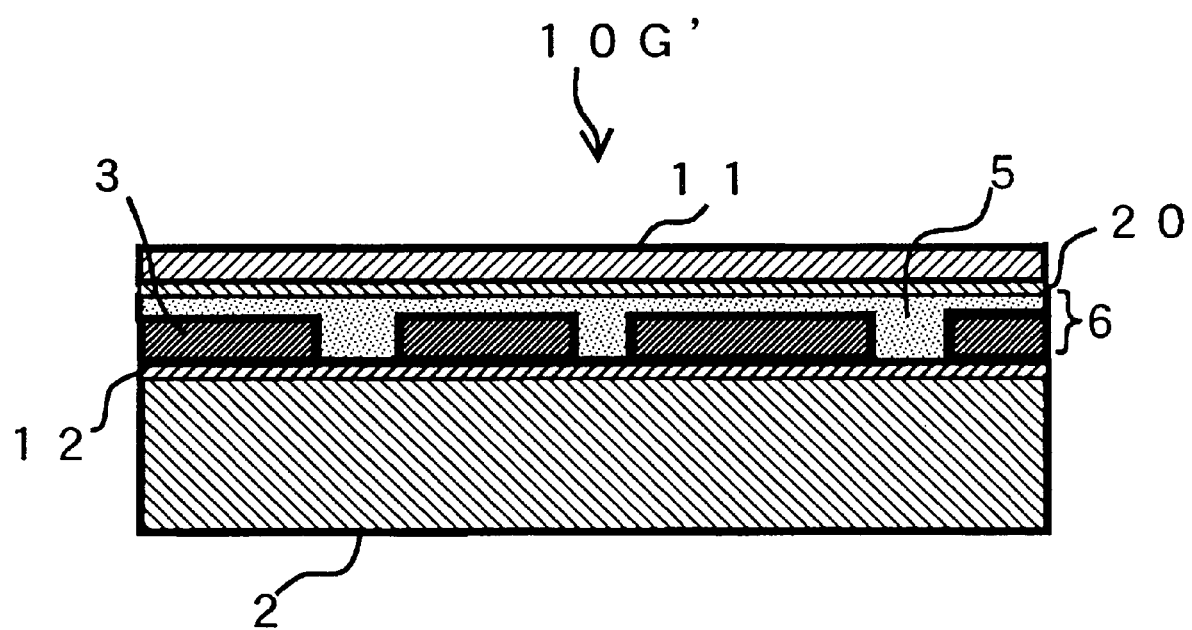

Variation 7: By using a dielectric-layer-provided copper foil having a binder metal layer between a copper foil used as a lower electrode and a dielectric layer, copper clad laminates 10G and 10G' for respectively forming a capacitor layer having a five layer configuration consisting essentially of a lower electrode forming layer, binder metal layer, dielectric layer, high-melting-point metal layer, and an upper electrode forming layer are formed as shown in FIG. 13.

Figure 14:
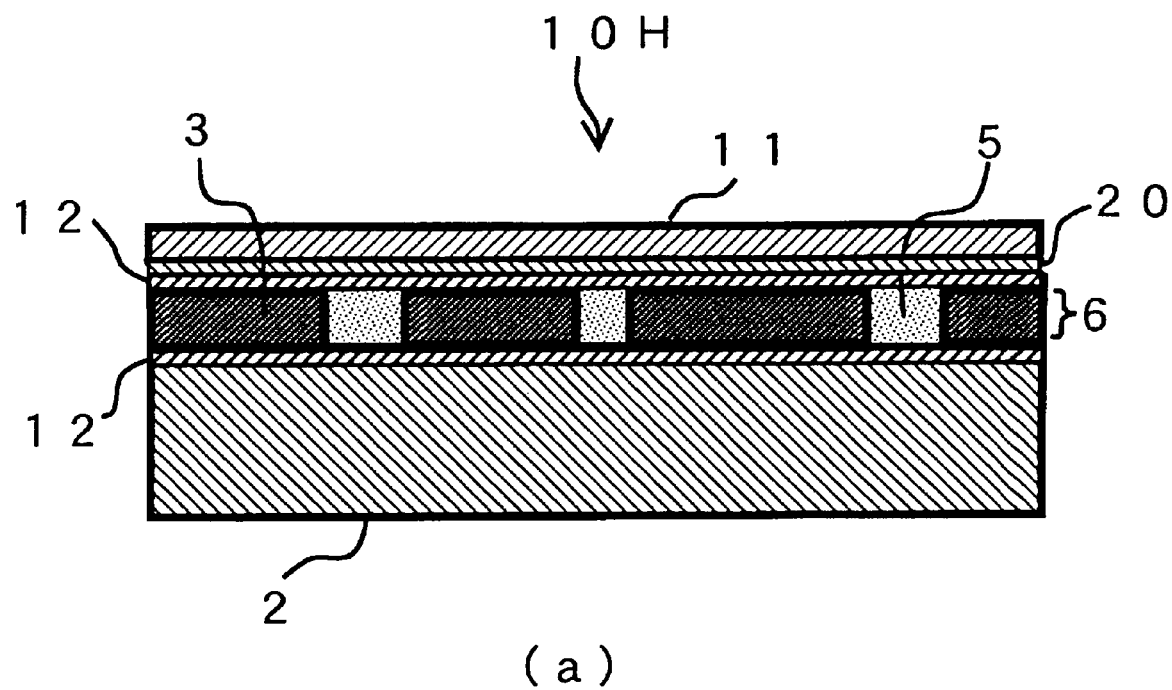
Figure 14:
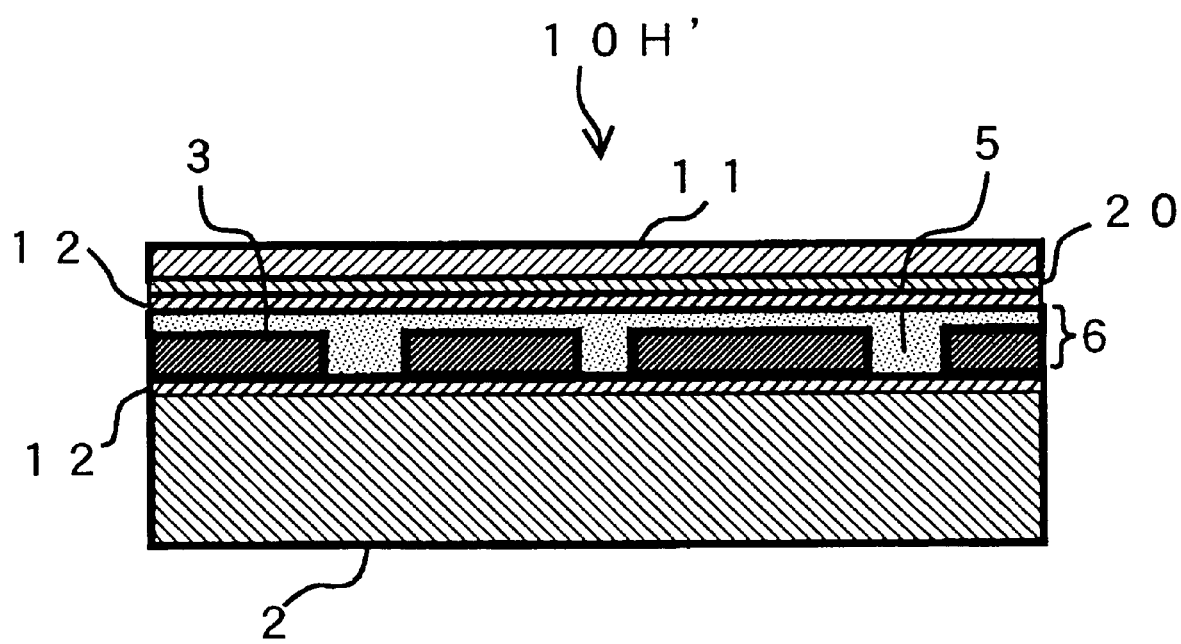

Variation 8: BY sing a dielectric-layer-provided copper foil having a binder metal layer between a copper foil used as a lower electrode and a dielectric layer, copper clad laminates 10H and 10H' for respectively forming a capacitor layer having a six layer configuration consisting essentially of a lower electrode forming layer, a binder metal layer, dielectric layer, a binder metal layer, a high-melting-point metal layer, and an upper electrode forming layer are formed as shown in FIG. 14.

Figure 15:
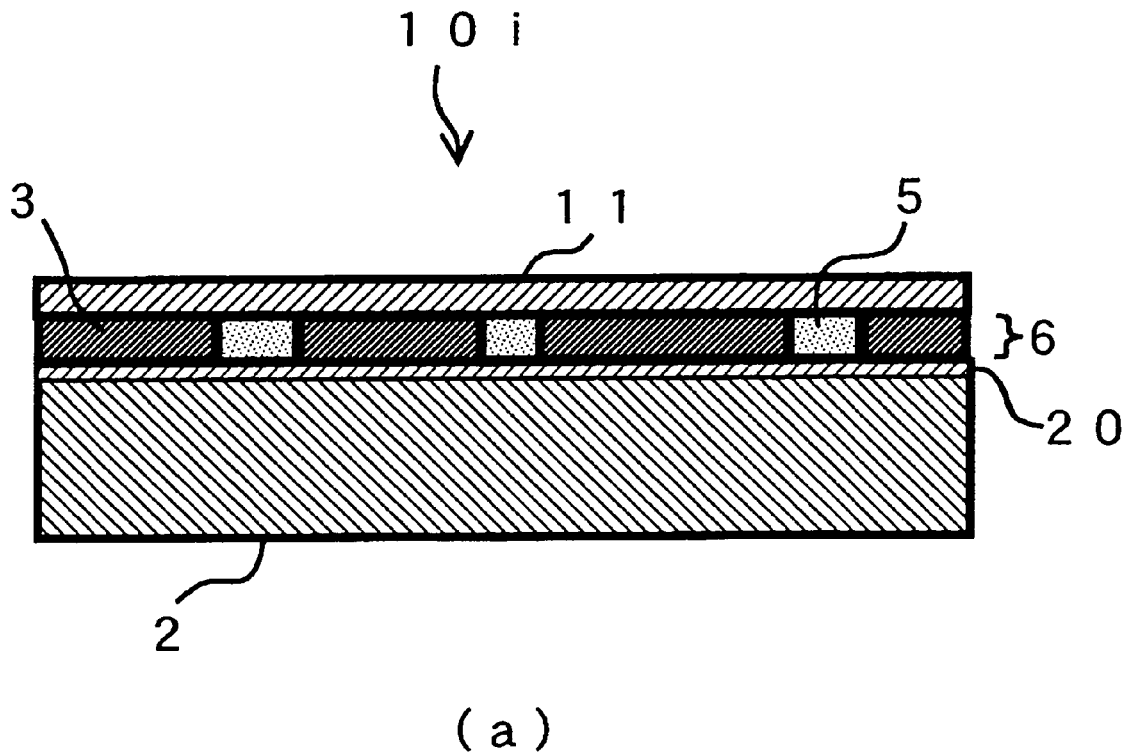
Figure 15:
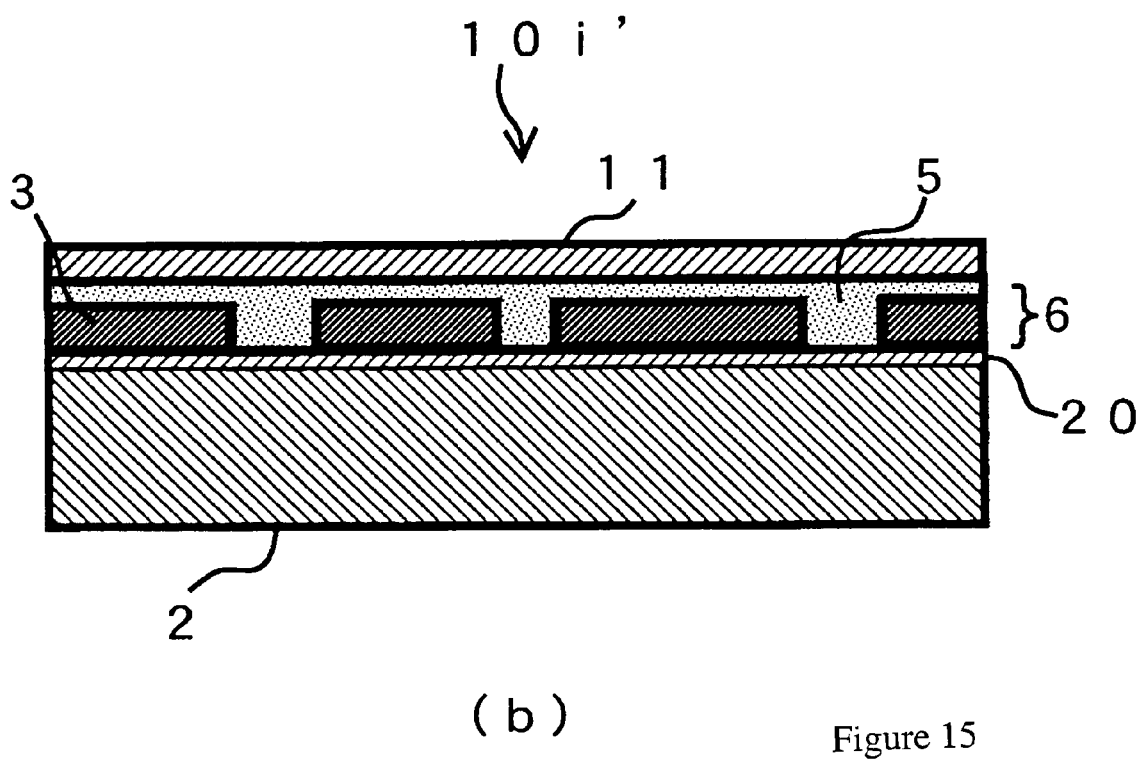

Variation 9: By using a dielectric-layer-provided copper foil having a high-melting-point metal layer between a copper foil used as a lower electrode and a dielectric layer, copper clad laminates 10i and 10i' for respectively forming a capacitor layer having a four layer configuration consisting essentially of a lower electrode forming layer, a high-melting-point metal layer, a dielectric layer, and an upper electrode forming layer are formed as sown in FIG. 15.

Figure 16:
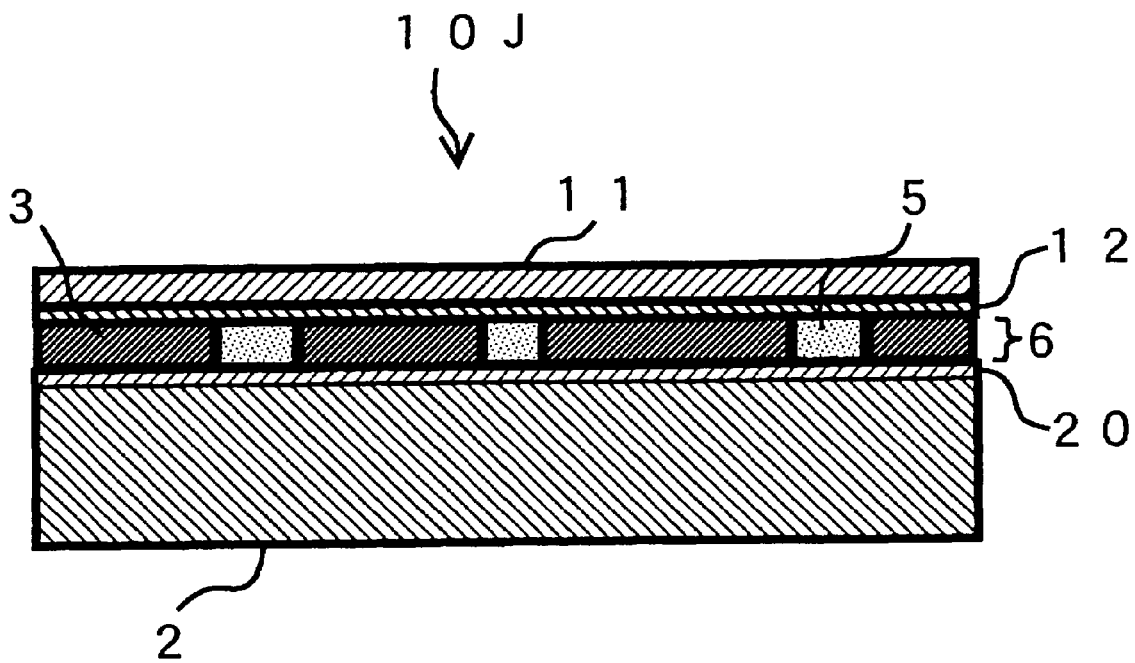
Figure 16:
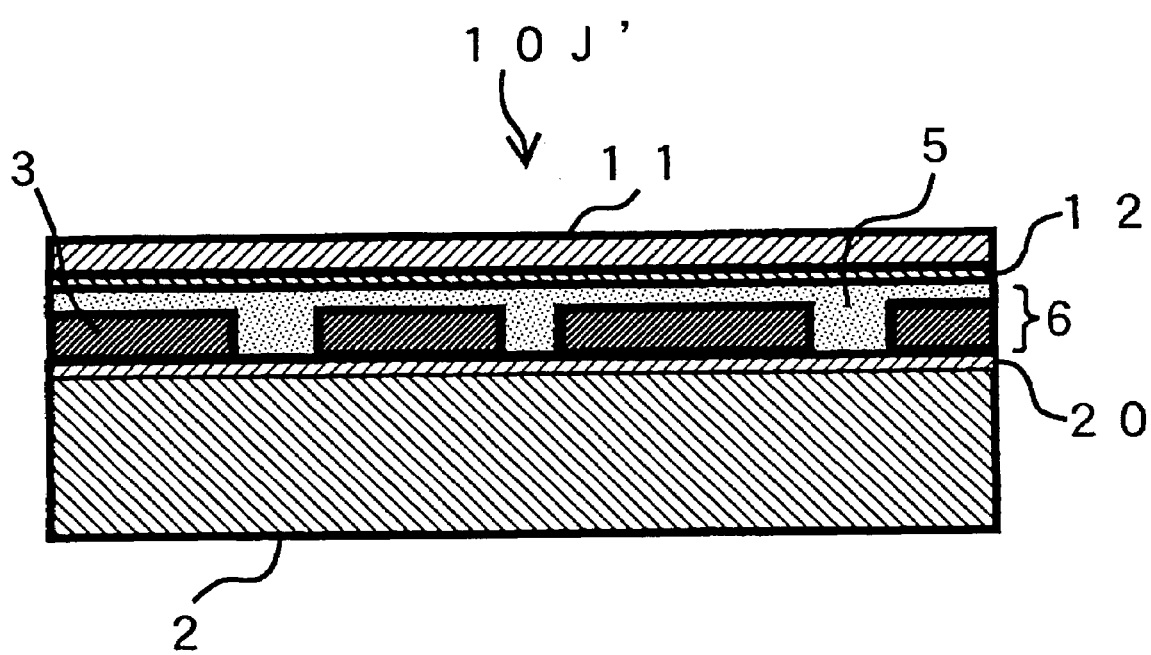

Variation 10: By using a dielectric-layer-provided copper foil having a high-melting-point metal layer between a copper foil used as a lower electrode and a dielectric layer, copper clad laminates 10J and 10J' for respectively forming a capacitor layer having a five layer configuration consisting essentially of a lower electrode forming layer, a high-melting-point metal layer, a dielectric layer, a binder metal layer, and an upper electrode forming layer are formed as shown in FIG. 16.

Figure 17:
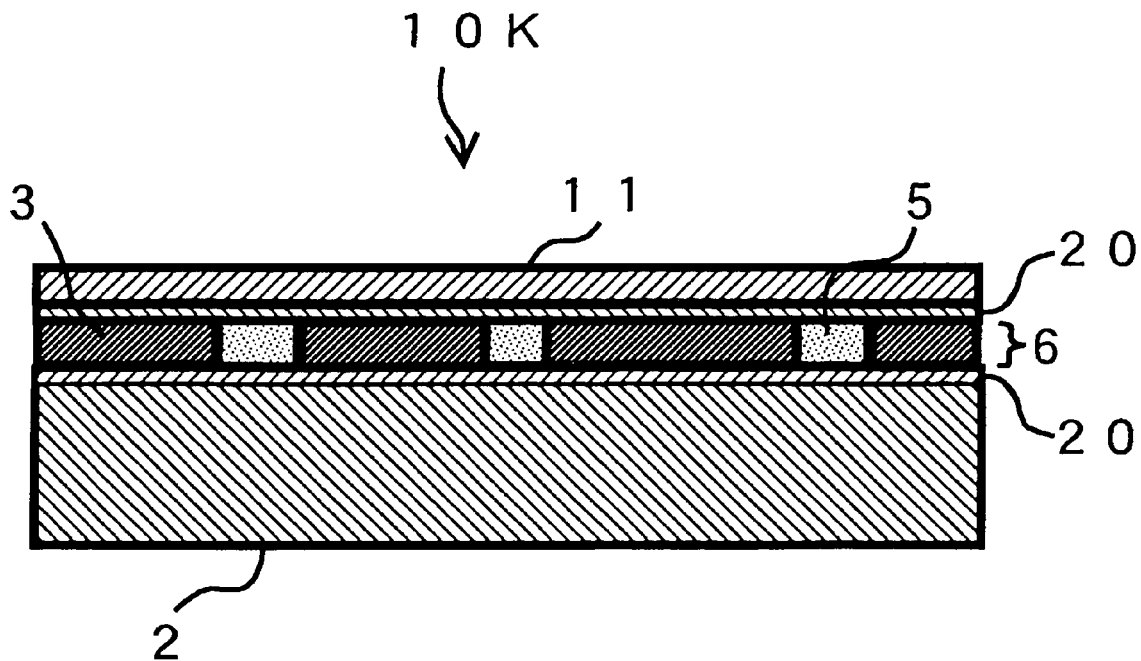
Figure 17:
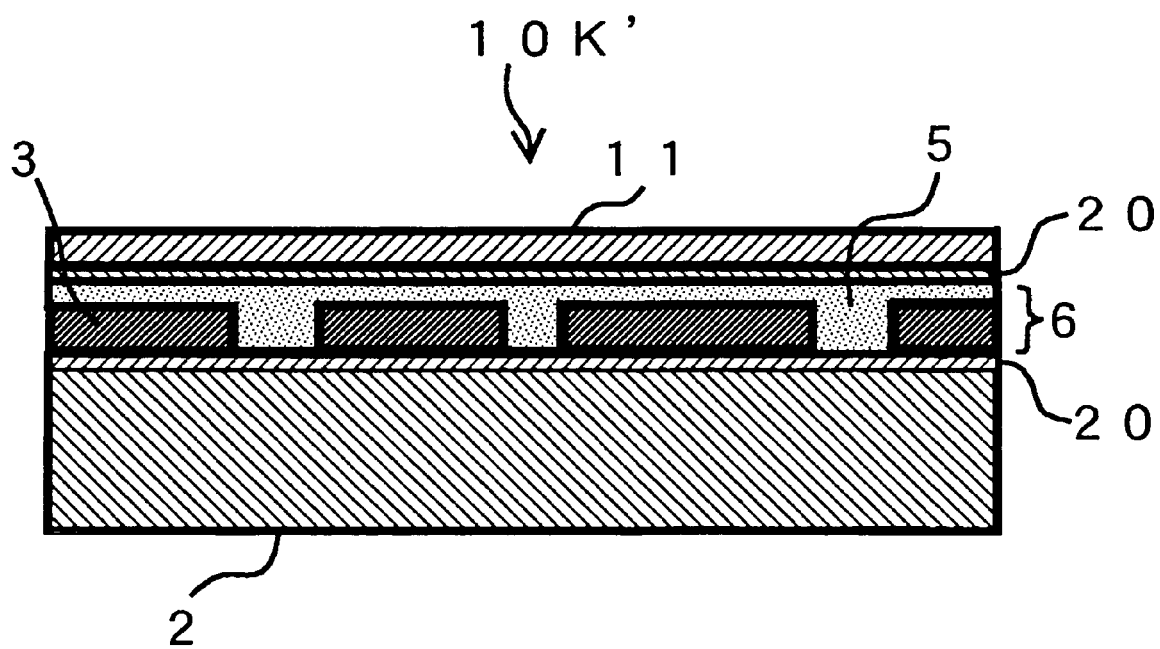

Variation 11: By using a dielectric-layer-provided copper foil having a high-melting-point metal layer between a copper foil used as a lower electrode and a dielectric layer, copper clad laminates 10K and 10K' for respectively forming a capacitor layer having a five layer configuration consisting essentially of a lower electrode forming layer, a high-melting-point metal layer, a dielectric layer, a high-melting-point metal layer, and an upper electrode forming layer are formed as shown in FIG. 17.

Figure 18:
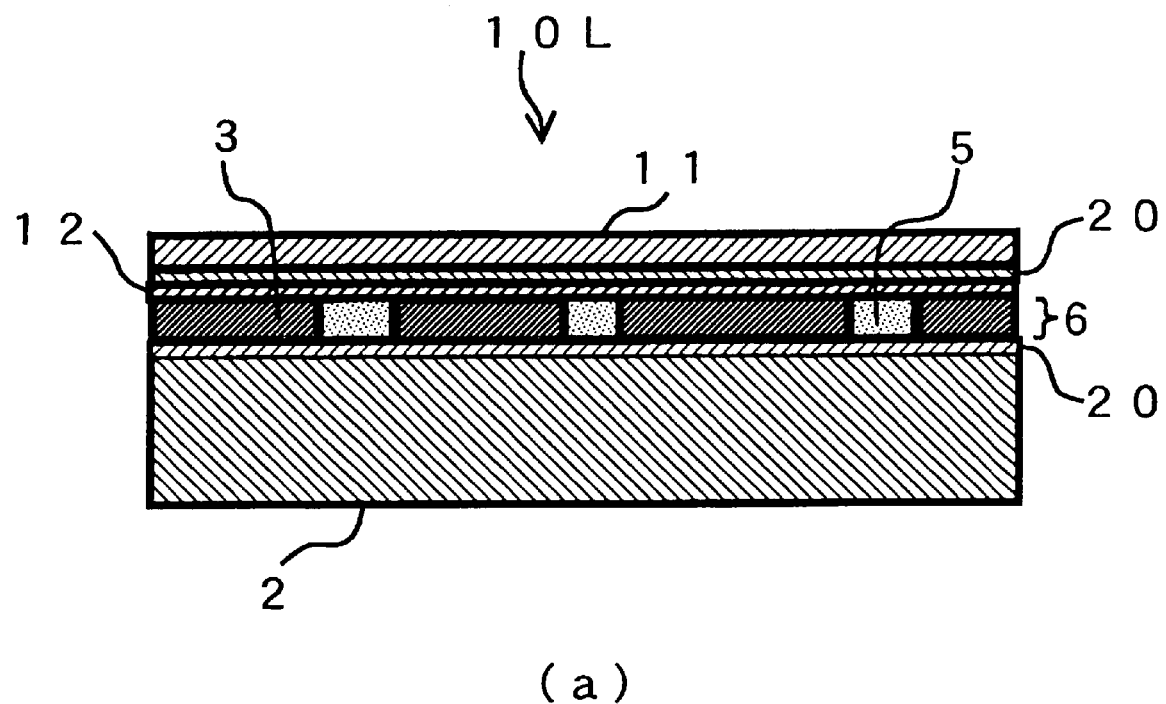
Figure 18:
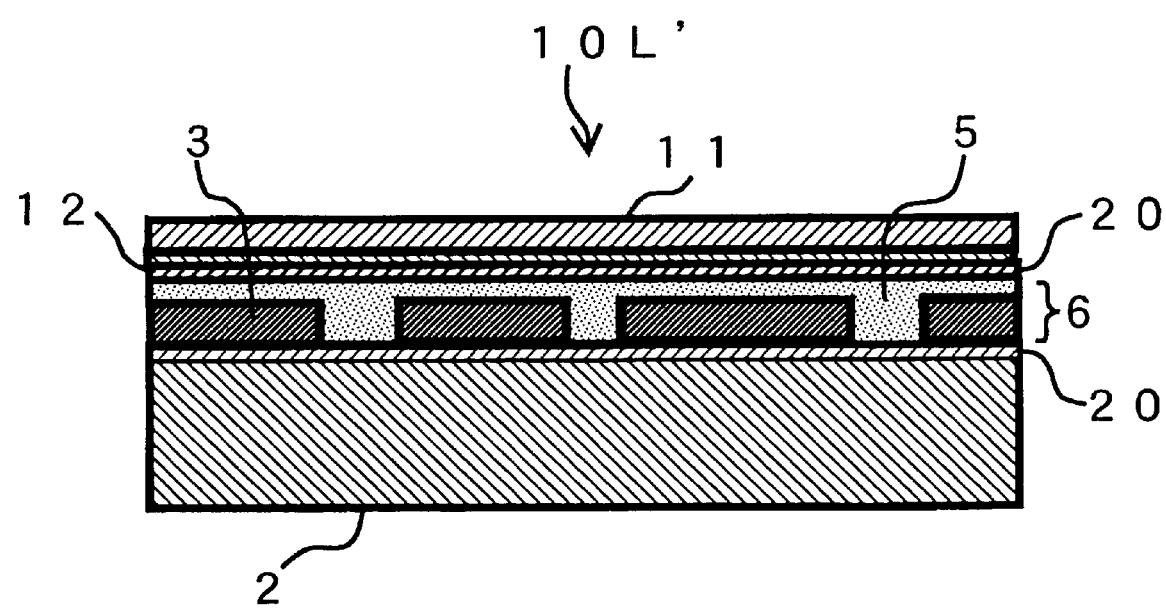

Variation 12: By using a dielectric-layer-provided copper foil having a high-melting-point metal layer between a copper foil used as a lower electrode and a dielectric layer, copper clad laminates 10L and 10L' for respectively forming a capacitor layer having a six layer configuration consisting essentially of a lower electrode forming layer, a high-melting-point metal layer, a dielectric layer, a binder metal layer, a high-melting-point metal layer, and an upper electrode forming layer are formed as shown in FIG. 18.

Figure 19:
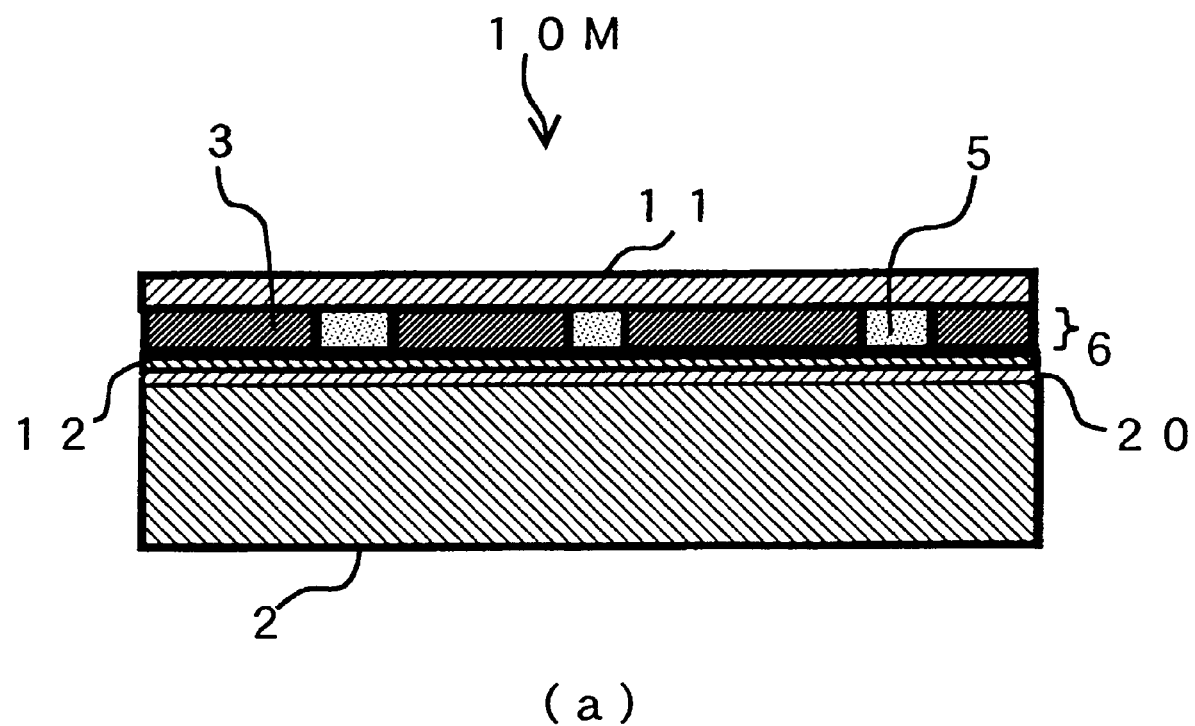
Figure 19:
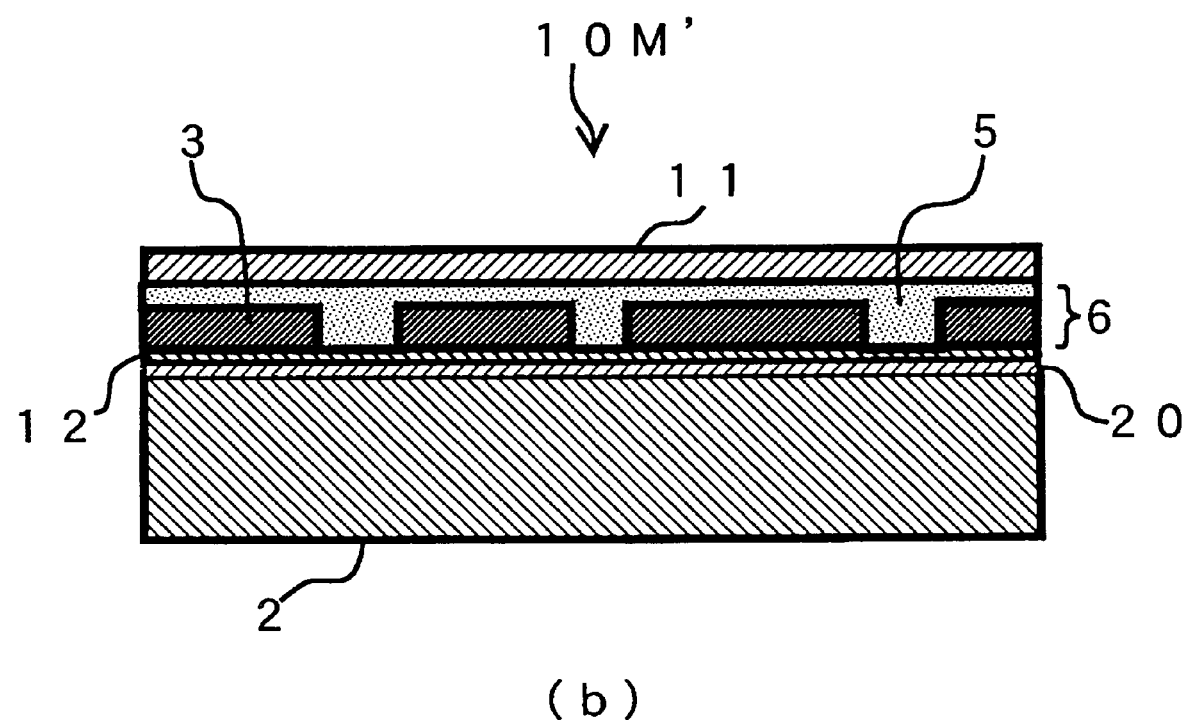

Variation 13: By using a dielectric-layer-provided copper foil having a high-melting-point metal layer and a binder metal layer between a copper foil used as a lower electrode and a dielectric layer, copper clad laminates 10M and 10M' for respectively forming a capacitor layer having a five layer configuration consisting essentially of a lower electrode forming layer, a high-melting-point metal layer, a binder metal layer, a dielectric layer, and an upper electrode forming layer are formed as shown in FIG. 19.

Figure 20:
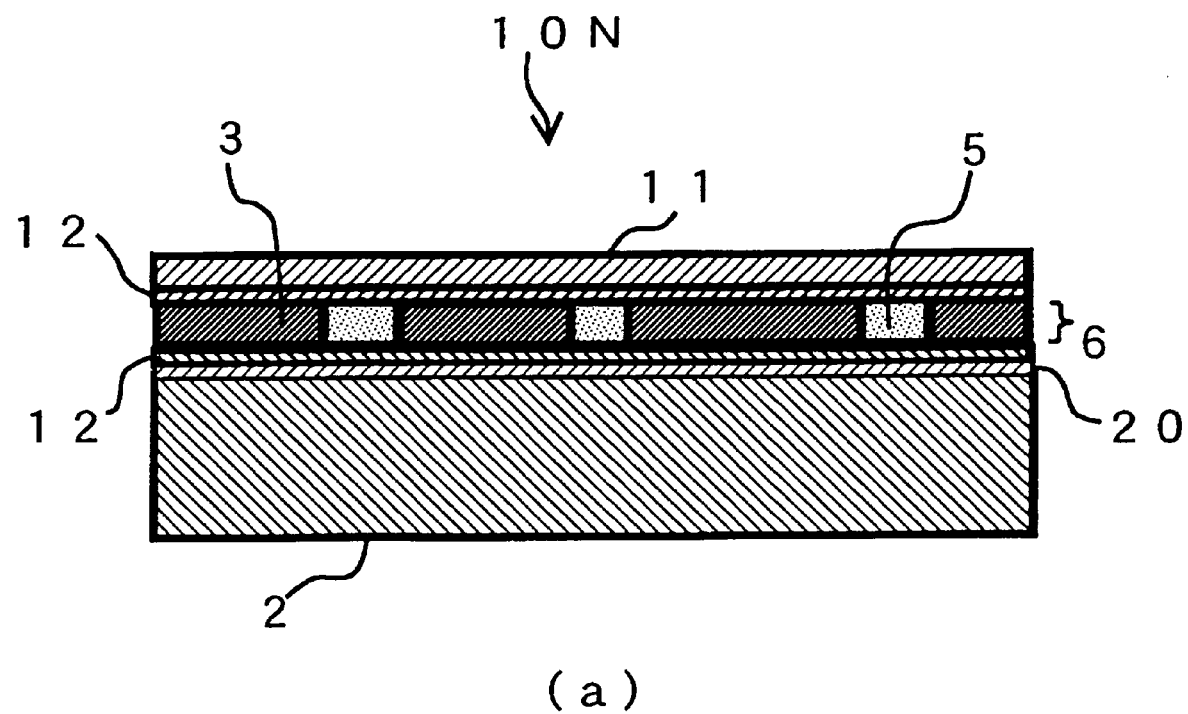
Figure 20:
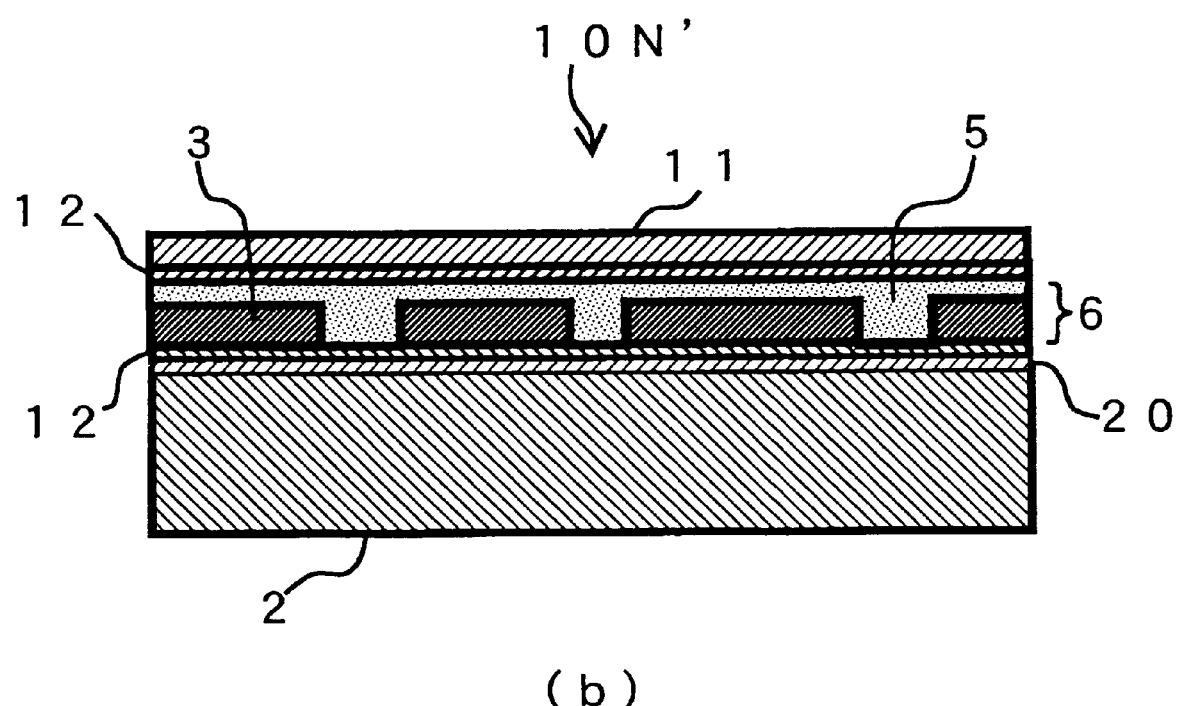

Variation 14: By using a dielectric-layer-provided copper foil having a high-melting-point metal layer and a binder metal layer between a copper foil used as a lower electrode and a dielectric layer, copper clad laminates 10N and 10N' for respectively forming a capacitor layer having a six layer configuration consisting essentially of a lower electrode forming layer, a high-melting-point metal layer, a binder metal layer, a dielectric layer, a binder metal layer, and an upper electrode forming layer are formed as shown in FIG. 20.

Figure 21:
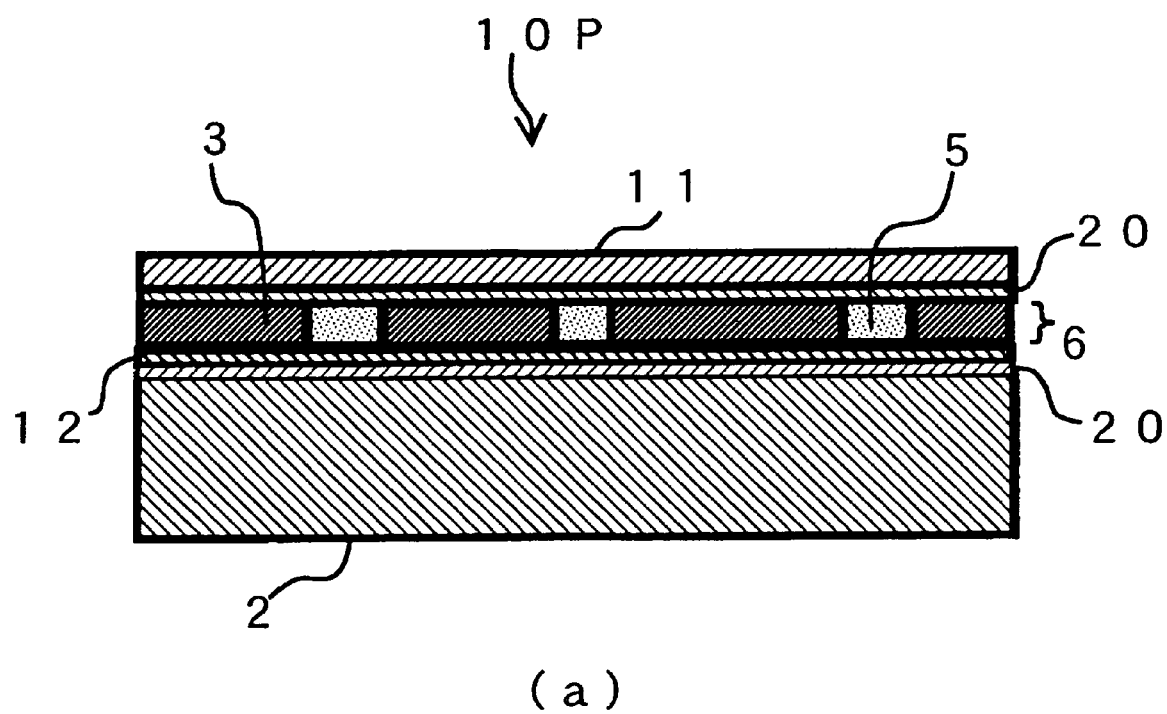
Figure 21:
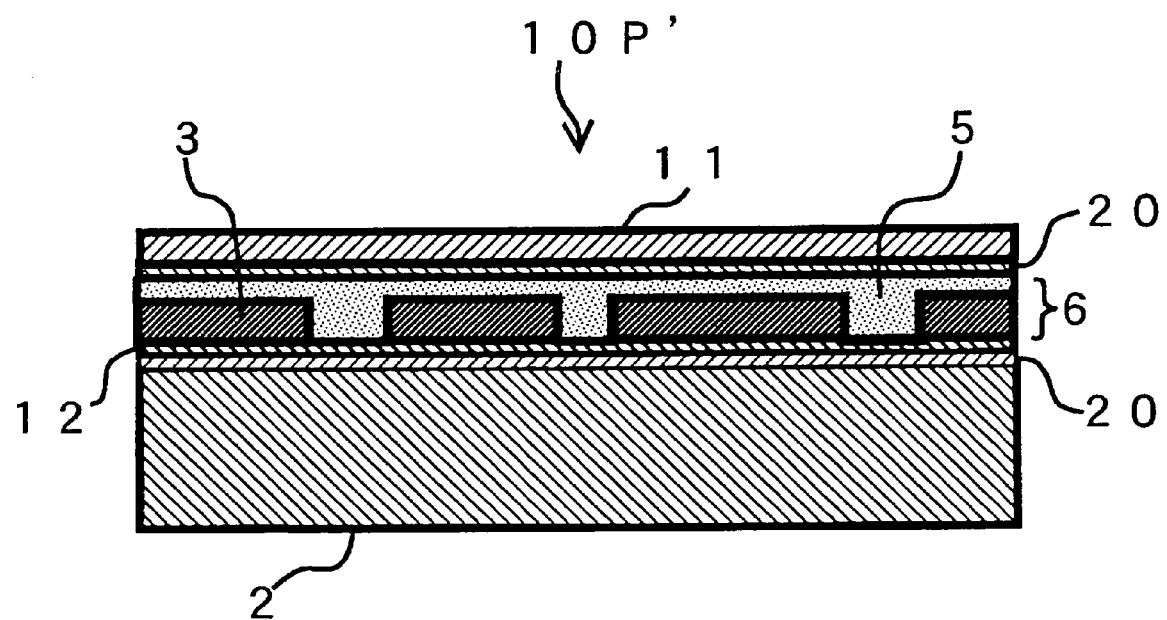

Variation 15: By using a dielectric-layer-provided copper foil having a high-melting-point metal layer and a binder metal layer between a copper foil used as a lower electrode and a dielectric layer, copper clad laminates 10P and 10P' for respectively forming a capacitor layer having a six layer configuration consisting essentially of a lower electrode forming layer, a high-melting-point metal layer, a binder metal layer, a dielectric layer, a high-melting-point metal layer, and an upper electrode forming layer are formed as shown in FIG. 21.

Figure 22:
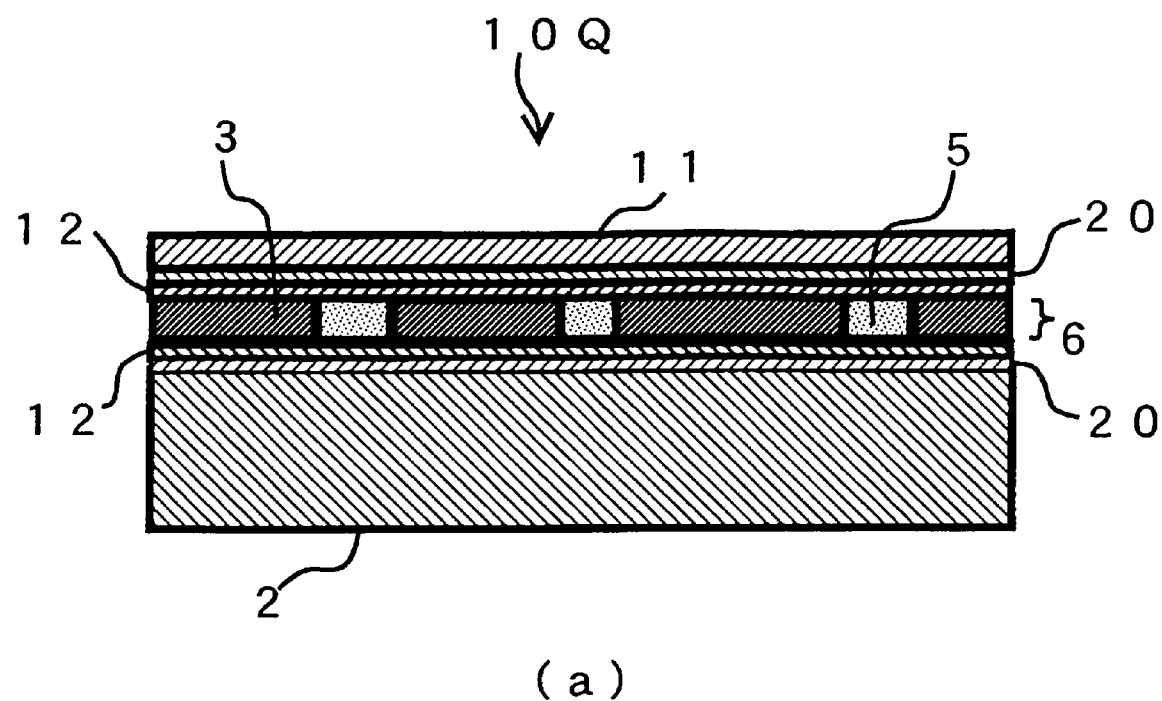
Figure 22:
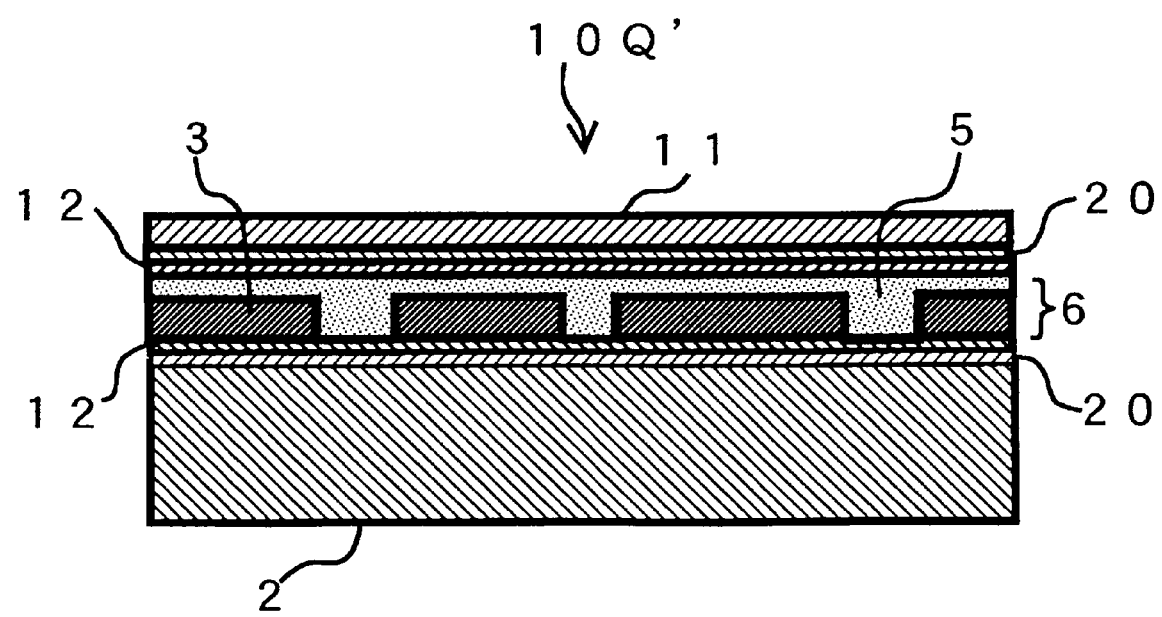

Variation 16: By using a dielectric-layer-provided copper foil having a high-melting-point metal layer and a binder metal layer between a copper foil used as a lower electrode and a dielectric layer, copper clad laminates 10Q and 10Q' for respectively forming a capacitor layer having a seven layer configuration consisting essentially of a lower electrode forming layer, a high-melting-point metal layer, a binder metal layer, a dielectric layer, a binder metal layer, a high-melting-point metal layer, and an upper electrode forming layer are formed as shown in FIG. 22.

Which variation is adopted among the above-described variations is optionally decided by considering the purpose and operating environment of a final printed wiring board obtained by using a copper clad laminate for forming a capacitor layer.

D. Advantages of the Present Invention

A dielectric-layer-provided copper foil of the present invention can completely prevent a short circuit between an upper electrode and a lower electrode of a capacitor circuit obtained by using the dielectric-layer-provided copper foil because the copper foil is embedded by a pit-like defective-portion polyimide resin produced on a metal-oxide sputter film having a high dielectric constant even if using the sputter film for the configuration of a dielectric layer. Moreover, when a polyimide resin film covers a metal-oxide sputter film, it is possible to prevent the metal-oxide sputter film constituting a dielectric layer from damaging.

Therefore, a copper clad laminate for forming a capacitor layer manufactured by using the dielectric-layer-provided copper foil has a thin dielectric layer having a uniform thickness and is able to effectively prevent a short circuit between a lower electrode and an upper electrode. Therefore, the laminate has a high dielectric constant, makes it possible to improve an electrostatic capacity as a capacitor, and has a few defects. Therefore, the quality stability when forming a capacitor circuit is extremely improved. Moreover, when the above-described high-melting-point metal layer is present, the adhesiveness between a dielectric layer and an electrode forming layer is improved because the high-melting-point metal layer is superior in migration property and a binder metal layer is present.

BEST MODE FOR CARRYING OUT THE INVENTION

The present invention is described below through manufacturing of a copper clad laminate for forming a capacitor layer of a printed wiring board.

EXAMPLE 1

In the case of this example, a dielectric-layer-provided copper foil 1A' shown in FIG. 1(b-2) was manufactured in accordance with the manufacturing flow shown below and a copper clad laminate 10A' for forming a capacitor layer shown in FIG. 7(b) was manufactured by using the copper foil 1A'. This example used a very low profile (VLP) copper foil having a nominal thickness of 18 μm but not undergoing a surface treatment as a copper foil 2 serving as a lower electrode forming layer.

<Manufacturing of Dielectric-layer-provided Copper Foil>

First, the surface of a copper foil having a size of 70 mm×70 mm was acid-cleaned by 2N sulfuric acid solution (room temperature) to remove contaminant and extra oxide and dried. Then, the acid-cleaned copper foil was put in the chamber of the sputtering vapor deposition system (CFS-12P-100). The sputtering condition was set so as to supply argon gas to an ion gun at a flow rate of 87 cm$^3$/min by setting the inside of the chamber to an ultimate vacuum of $1.2 \times 10^3$ Pa. Then, the surface of the copper foil first completing acid cleaning was cleaned by inversely sputtering the surface with argon ions. The inverse sputtering conditions were set to an inverse sputtering power of 1,000 W and an inverse sputtering time of 10 min.

When the inverse sputtering of the surface of the copper foil was completed, oxygen gas was slowly leaked into the chamber of the sputtering vapor deposition system at a flow rate of 29 cm$^3$/min. Then, a tantalum target was used as a target, a sputtering power of 1,500 W, a presputtering time of 8 min, and sputtering time of 749.6 min were set, and a tantalum oxide film was formed on the surface of the copper foil as an inorganic-oxide sputter film having a thickness of approx. 1.0 μm.

As described above, the copper foil on whose one side the tantalum oxide film was formed was taken out from the chamber of the sputtering vapor deposition system and the pit-like defective portion of the tantalum oxide film was sealed by polyimide resin.

In the case of the electrodeposition method used for the sealing, the polyimide electrodeposited solution GNW-100 made by PI GIJUTSU KENKYUSHO Co., Ltd. was used as a polyimide electrodeposited solution. The pit-like defective portion of the tantalum oxide film was embedded by using the polyimide electrodeposited solution and a polyimide resin film was formed on the surface. In this case, the dielectric-layer-provided copper foil 1A' shown in FIG. 1(b-2) was obtained by setting the temperature of the polyimide electrodeposited solution to 25° C., using a copper foil 2 on which a tantalum oxide film was formed as a positive electrode and a stainless steel plate as a negative electrode, applying a DC voltage of 15 V to electrolyze it for 5 min and thereby electrodeposited polyimide resin, embedding the pit-like defective portion of the tantalum oxide film, forming a polyimide resin film having a thickness of 4 μm on the surface of the pit-like defective portion, cleaning the polyimide resin film by Q-AM-X068 made by PI GIJUTSU KENKYUSHO Co., Ltd. as a solvent for 30 min, holding the film in the temperature atmosphere of 90° C. for 30 min, and then holding the film in the temperature atmosphere of 120° C. for 30 min, and raising the atmosphere temperature to 180° C. and holding it for 30 min, and further raising the atmosphere temperature to 250° C. and holding it for 30 min, and thereby drying it.

<Manufacturing of Copper Clad Laminate for Forming Capacitor Layer>

A copper layer having a thickness of 0.6 μm and serving as the upper electrode forming layer 11 was formed on the surface of the dielectric layer 6 by using the dielectric-layer-provided copper foil 1A' obtained as described above and the sputtering vapor deposition method for the surface of the dielectric layer 6.

The sputtering vapor deposition system and basic sputtering condition used in this case were the same as described above. However, cleaning by the inverse sputtering was omitted. Moreover, a copper target was used as the target to be set in the chamber of the sputtering vapor deposition system, presputtering (presputtering power of 1,000 W and presputtering time of 10 min) was performed, film forming sputtering (sputtering power of 3,000 W and sputtering time of 9.1 min) was performed, and a copper layer serving as the upper electrode forming layer 11 and having a thickness of approx. 0.5 μm was formed on the surface of the dielectric layer 6.

Thus, the copper clad laminate 10A' for forming a capacitor layer formed by such three layers as the lower electrode forming layer 2, a dielectric layer 6, and an upper electrode forming layer 11 shown in FIG. 7(b) was obtained. Thus, as a result of checking whether a short circuit occurred between the copper foil 2 serving as a lower electrode forming layer and the upper electrode forming layer 11 at 20 places in the state of the copper clad laminate thus manufactured, it was impossible to find a place where a short circuit occurred.

EXAMPLE 2

In the case of this example, the dielectric-layer-provided copper foil 1A' shown in FIG. 1(b-2) was manufactured in accordance with the manufacturing flow shown below and the copper clad laminate 10B' for forming a capacitor layer shown in FIG. 8(b) was manufactured by using the copper foil 1A'. This example used a very low profile (VLP) copper foil having a nominal thickness of 18 μm but not undergoing the surface treatment as the copper foil 2 serving as a lower electrode forming layer.

<Manufacturing of Dielectric-layer-provided Copper Foil>

Because manufacturing of the dielectric-layer-provided copper foil 1A' shown in FIG. 1(b-2) was the same as the case of the Example 1, its description was omitted in order to avoid duplicate description.

<Manufacturing of Copper Clad Laminate for Forming Capacitor Layer>

The binder metal layer 12 was formed by using the dielectric-layer-provided copper foil 1A' obtained as described above and applying the sputtering vapor deposition method to the surface of the dielectric layer 6. The binder metal layer 12 was formed by using the sputtering vapor deposition method. In the case of the sputtering vapor deposition system and basic sputtering condition used in this case, cleaning by inverse sputtering like the case of forming the upper electrode forming layer 11 of the Example 1 was not performed. Moreover, a chromium target was used as the target to be set in the chamber of the sputtering vapor deposition system, presputtering (presputtering power of 2,000 W and presputtering time of 8 min) was performed and film-forming sputtering (sputtering power of 2,000 W and sputtering time of 1.3 min) was performed to form a chromium layer having a thickness of approx. 30 nm on the surface of the dielectric layer 6.

Moreover, a copper layer having a thickness of 0.5 μm and serving as the upper electrode forming layer 11 was formed on a chromium layer formed as the binder metal layer 12 by using the sputtering method same as the case of the Example 1.

Thus, the copper clad laminate 10B' for forming a capacitor layer formed by such four layers as the lower electrode forming layer 2, dielectric layer 6, binder metal layer 12, and upper electrode forming layer 11 shown in FIG. 8(b) was obtained. As a result of checking whether a short circuit occurred between the copper foil 2 serving as a lower electrode forming layer and the upper electrode forming layer 11 at 20 places in the state of the copper clad laminate thus manufactured, it was impossible to fine a place where a short circuit occurred.

EXAMPLE 3

In the case of this example, the dielectric-layer-provided copper foil 1A' shown in FIG. 1(b-2) was manufactured in accordance with the manufacturing flow shown below and the copper clad laminate 10C' for forming a capacitor layer shown in FIG. 9(b) was manufactured by using the copper foil 1A'. In the case of this example, a very low profile (VLP) copper foil having a nominal thickness of 18 μm but not undergoing a surface treatment was used as the copper foil 2 serving as a lower electrode forming layer.

<Manufacturing of Dielectric-layer-provided Copper Foil>

Because manufacturing of the dielectric-layer-provided copper foil 1A' shown in FIG. 1(b-2) was the same as the case of the Example 1, its description was omitted here in order to avoid duplicate description.

<Manufacturing a Copper Clad Laminate for Forming Capacitor Layer>

The high-melting-point metal layer 20 was formed on the surface of the dielectric layer 6 by using the dielectric-layer-provided copper foil 1A' obtained as described above and the sputtering vapor deposition method. The high-melting-point metal layer 20 was formed by using the sputtering vapor deposition method. In the case of the sputtering vapor deposition system and basic sputtering condition used in this case, cleaning by inverse sputtering like the case of forming the upper electrode forming layer 11 of the Example 1 was omitted, a nickel target was used for the target set in the chamber of a sputtering vapor deposition system, presputtering (presputtering power of 2,000 W and presputtering time of 5 min) was performed, and film-forming sputtering (sputtering power of 2,000 W and sputtering time of 1.5 min) was performed to form a nickel layer having a thickness of approx. 30 nm on the surface of the dielectric layer 6.

Moreover, a copper layer having a thickness of 0.5 μm and serving as the upper electrode forming layer 11 was formed on a nickel layer formed as the high-melting-point metal layer 20 by using the sputtering method same as the case of the Example 1.

Thus, the copper clad laminate 10C' for forming a capacitor layer formed by such four layers consisting essentially of the lower electrode forming layer 2, dielectric layer 6, high-melting-point metal layer 20, and upper electrode forming layer 11 shown in FIG. 9(b) was obtained. As a result of checking whether a short circuit occurred between the copper foil 2 serving as a lower electrode forming layer and the upper electrode forming layer 11 at 20 places under the state of the copper clad laminate thus manufactured, it was impossible to find a place where a short circuit occurred.

EXAMPLE 4

In the case of this example, the dielectric-layer-provided copper foil 1A' shown in FIG. 1(b-2) was manufactured in accordance with the manufacturing flow shown below and the copper clad laminate 10D' for forming a capacitor layer shown in FIG. 10(b) was manufactured by using the foil 1A'. This example used a very low profile (VLP) having a nominal thickness of 18 μm but not undergoing a surface treatment as the copper foil 2 serving as a lower electrode forming layer.

<Manufacturing of Dielectric-layer-provided Copper Foil>

Because manufacturing of the dielectric-layer-provided copper foil 1A' shown in FIG. 1(b-2) was the same as the case of the Example 1, its description was omitted in order to avoid duplicate description.

<Manufacturing of Copper Clad Laminate for Forming Capacitor Layer>

A chromium layer having a thickness of 30 nm was formed as the binder metal layer 12 by using the dielectric-layer-provided copper foil 1A', applying the sputtering vapor deposition method to the surface of the dielectric layer 6, and using the sputtering method same as the case of the Example 2.

Moreover, a nickel layer having a thickness of 50 nm was formed as the high-melting-point metal layer 20 on a chromium layer formed as the binder metal layer 12 similarly to the case of the Example 3.

Furthermore, a copper layer having a thickness of 5 μm and serving as the upper electrode forming layer 11 was formed on the high-melting-point metal layer 20 by using the sputtering method used for the Example 1.

Thus, the copper clad laminate 10D' for forming a capacitor layer formed by such four layers consisting essentially of the lower electrode forming layer 2, dielectric layer 6, binder metal layer 12, high-melting-point metal layer 20, and upper electrode forming layer 11 shown in FIG. 10(b) was obtained. As a result of checking whether a short circuit occurred between the copper foil 2 serving as a lower electrode forming layer and the upper electrode forming layer 11 at 20 places under the state of the copper clad laminate thus manufactured, it was impossible to find a place where a short circuit occurred.

EXAMPLE 5

In the case of this example, the dielectric-layer-provided copper foil 1C' shown in FIG. 3(b-2) was manufactured in accordance with the manufacturing flow shown below and the copper clad laminate 10E' for forming a capacitor layer shown in FIG. 11(b) was manufactured by using the copper foil 1C'. This example used a very low profile (VLP) copper foil having a nominal thickness of 18 μm but not undergoing a surface treatment as the copper foil 2 serving as a lower electrode forming layer.

<Manufacturing of Dielectric-layer-provided Copper Foil>

First, the surface of a copper foil having a size of 70 mm×70 mm was acid-cleaned by 2N sulfuric acid solution (room temperature) to remove contaminant and extra oxide and dried. Then, the acid-cleaned copper foil was put in the chamber of the sputtering vapor deposition system (CFS-12P-100). Sputtering conditions were set so that the inside of the chamber becomes an ultimate vacuum of $1.2 \times 10^{-3}$ Pa and argon gas was supplied to an ion gun at a flow rate of 87 cm$^3$/min. Then, the surface of the copper foil whose acid cleaning was first completed was cleaned by inversely sputtering the surface by argon gas. The inverse sputtering conditions were set to an inverse sputtering power of 1,000 W and an inverse sputtering time of 10 min.

When inverse sputtering of the surface of the copper foil was completed, a chromium target was used as the target to be set in the chamber of the sputtering vapor deposition system, presputtering (presputtering power of 1,000 W and presputtering time of 1.3 min) was performed and film-forming puttering (sputtering power of 2,000 W and sputtering time of 5 min) was performed to form a chromium layer having a thickness of approx. 30 nm on the surface of the copper foil 2 as the binder metal layer 12.

Then, oxygen gas was slowly leaked into the chamber of the sputtering vapor deposition system at a flow rate of 29 cm$^3$/min and a tantalum target was used as the target, and sputtering power of 1,500 W, presputtering time of 8 min, and sputtering time of 749.6 min were set to form a tantalum oxide film on the surface of the binder metal layer 12 as an inorganic-oxide sputter film having a thickness of approx. 1.0 µm.

Thus, the copper foil on whose one side the binder metal layer 12 and tantalum oxide film were formed was taken out from the chamber of the sputtering vapor deposition system and the pit-like defective portion of the tantalum oxide film was sealed by polyimide resin similarly to the case of the Example 1. Thus, the dielectric-layer-provided copper foil 1C' shown in FIG. 3(b-2) was obtained.

<Manufacturing of Copper Clad Laminate for Forming Capacitor Layer>

A copper layer having a thickness of 0.5 µm and serving as the upper electrode forming layer 11 was formed on the surface of the dielectric layer 6 by using the dielectric-layer-provided copper foil 1A' obtained as described above and the sputtering vapor deposition method. The sputtering vapor deposition system and basic sputtering condition used here were the same as the case of the Example 1.

Thus, the copper clad laminate 10E' for forming a capacitor layer formed by such four layers consisting essentially of the lower electrode forming layer 2, binder metal layer 12, dielectric layer 6, and upper electrode forming layer 11 shown in FIG. 11(b) was obtained. As a result of checking whether a short circuit occurred between the copper foil 2 serving as a lower electrode forming layer and the upper electrode forming layer 11 at 20 places under the state of the copper clad laminate thus manufactured, it was impossible to find a place where a short circuit occurred.

EXAMPLE 6

In the case of this example, the dielectric-layer-provided copper foil 1C' shown in FIG. 3(b-2) was manufactured in accordance with the manufacturing flow shown below and the copper clad laminate 10F' for forming a capacitor layer shown in FIG. 12(b) was manufactured by using the copper foil 1C'. This example used a very low profile (VLP) copper foil having a nominal thickness of 18 µm but not undergoing a surface treatment as the copper foil 2 serving as a lower electrode forming layer.

<Manufacturing of Dielectric-layer-provided Copper Foil>

Because manufacturing of the dielectric-layer-provided copper foil 1C' shown in FIG. 3(b-2) was the same as the case of the Example 5, its description was omitted in order to avoid duplicate description.

<Manufacturing of Copper Clad Laminate for Forming Capacitor Layer>

The binder metal layer 12 was formed by using the dielectric-layer-provided copper foil 1C' obtained as described above and applying the sputtering vapor deposition method to the surface of the dielectric layer 6. In the case of the binder metal layer 12, a chromium layer having a thickness of approx. 30 nm was formed on the surface of the dielectric layer 6 similarly to the case of the Example 2.

Moreover, a copper layer having a thickness of 1.0 µm and serving as the upper electrode forming layer 11 was formed on a chromium layer formed as the binder metal layer 12 by using the sputtering method used for the Example 1.

Thus, the copper clad laminate 10F' for forming a capacitor layer formed by five layers consisting essentially of the lower electrode forming layer 2, binder metal layer 12, dielectric layer 6, binder metal layer 12, and upper electrode forming layer 11 shown in FIG. 12(b) was obtained. As a result of checking whether a short circuit occurred between the copper foil 2 serving as a lower electrode forming layer and the upper electrode forming layer 11 at 20 places under the state of the copper clad laminate thus manufactured, it was impossible to find a place where a short circuit occurred.

EXAMPLE 7

In the case of this example, the dielectric-layer-provided copper foil 1C' shown in FIG. 3(b-2) was manufactured in accordance with the manufacturing flow shown below and the copper clad laminate 10G' for forming a capacitor layer shown in FIG. 13(b) by using the foil 1C'. This example used a very low profile (VLP) copper foil having a nominal thickness of 18 µm but not undergoing a surface treatment as the copper foil 2 serving as a lower electrode forming layer.

<Manufacturing of Dielectric-layer-provided Copper Foil>

Because manufacturing of the dielectric-layer-provided copper foil 1C' shown in FIG. 3(b-2) was the same as the case of the Example 5, its description was omitted in order to avoid duplicate description.

<Manufacturing of Copper Clad Laminate for Forming Capacitor Layer>

The high-melting-point metal layer 20 was formed by using the dielectric-layer-provided copper foil 1C' obtained as described above and applying the sputtering vapor deposition method to the surface of the dielectric layer 6. The high-melting-point metal layer 20 was formed by using the sputtering vapor deposition method. In the case of the sputtering vapor deposition system and basic sputtering condition used in this case, cleaning by inverse sputtering like the case of forming the upper electrode forming layer 11 of the Example 1 was omitted, a nickel target was used as the target to be set in the chamber of a sputtering vapor deposition system, presputtering (presputtering power of 2,000 W and presputtering time of 5 min) was performed and film-forming sputtering (sputtering power of 2,000 W and sputtering time of 1.5 min) was performed to form a nickel layer having a thickness of approx. 30 nm on the surface of the dielectric layer 6.

Moreover, a copper layer having a thickness of 1.0 µm and serving as the upper electrode forming layer 11 was formed on a nickel layer formed as the high-melting-point metal layer 20 by using the sputtering method same as the case of the Example 1.

Thus, the copper clad laminate 10G' for forming a capacitor layer formed by five layers consisting essentially of the lower electrode forming layer 2, binder metal layer 12, dielectric layer 6, high-melting-point metal layer 20, and upper electrode forming layer 11 shown in FIG. 13(b) was obtained. As a result of checking whether a short circuit occurred between the copper foil 2 serving as a lower electrode forming layer and the upper electrode forming layer 11 at 20 places under the state of the copper clad laminate thus manufactured, it was impossible to find a place where a short circuit occurred.

EXAMPLE 8

In the case of this example, the dielectric-layer-provided copper foil 1C' shown in FIG. 3(b-2) was manufactured in accordance with the manufacturing flow shown below and the copper clad laminate 10H' for forming a capacitor layer shown in FIG. 14(b) was manufactured by using the copper foil 1C'. This example used a very low profile (VLP) copper foil having a nominal thickness of 18 μm but not undergoing a surface treatment as the copper foil 2 serving as a lower electrode forming layer.

<Manufacturing of Dielectric-layer-provided Copper Foil>

Because manufacturing of the dielectric-layer-provided copper foil 1C' shown in FIG. 3(b-2) was the same as the case of the Example 5, its description is omitted in order to avoid duplicate description.

<Manufacturing of Copper Clad Laminate for Forming Capacitor Layer>

A chromium layer having a thickness of 30 nm was formed as the binder metal layer 12 by using the dielectric-layer-provided copper foil 1C', applying the sputtering vapor deposition method to the surface of the dielectric layer 6, and using the sputtering method same as the case of the Example 2.

Moreover, a nickel layer having a thickness of 30 nm was formed as the high-melting-point metal layer 20 on the chromium layer formed as the binder metal layer 12 similarly to the case of the Example 3.

Furthermore, a copper layer having a thickness of 0.5 μm and serving as the upper electrode forming layer 11 was formed on the high-melting-point metal layer 20b using the sputtering method same as the case of the Example 1.

Thus, the copper clad laminate 10H' for forming a capacitor layer formed by six layers consisting essentially of the lower electrode forming layer 2, binder metal layer 12, dielectric layer 6, binder metal layer 12, high-melting-point metal layer 20, and upper electrode forming layer 11 shown in FIG. 14(b) was obtained. As a result of checking whether a short circuit occurred between the copper foil 2 serving as a lower electrode forming layer and the upper electrode forming layer 11 at 20 places under the state of the copper clad laminate thus manufactured, it was impossible to find a place where a short circuit occurred.

EXAMPLE 9

In the case of this example, the dielectric-layer-provided copper foil 1D' shown in FIG. 4(b-2) was manufactured in accordance with the manufacturing flow shown below and the copper clad laminate 10i' for forming a capacitor layer shown in FIG. 15(b) was manufactured by using the copper foil 1D'. This example used a very low profile (VLP) copper foil having a nominal thickness of 18 μm but not undergoing a surface treatment as the copper foil 2 serving as a lower electrode forming layer.

<Manufacturing of Dielectric-layer-provided Copper Foil>

First, the surface of a copper foil having a size of 70 mm×70 mm was acid-leaned by 2N sulfuric acid solution (room temperature) to remove contaminant and extra oxide and dried. Then, the acid-cleaned copper foil was put in the chamber of the sputtering vapor deposition system (CFS-12P-100). Sputtering conditions were set so that the ultimate vacuum in the chamber was $1.2 \times 10^{-3}$ Pa and argon gas was supplied to an ion gun at a flow rate of 87 cm³/min. Moreover, the surface of the copper foil whose acid cleaning was first completed was cleaned by inversely sputtering the surface with argon ions. The inverse sputtering conditions were set so to inverse sputtering power of 1,000 W and inverse sputtering time of 10 min.

When inverse sputtering of the surface of the copper foil was completed, a nickel target was used as the target to be set in the chamber of the sputtering vapor deposition system, presputtering (presputtering power of 2,000 W and presputtering time of 5 min) was performed and film-forming sputtering (sputtering power of 2,000 W and sputtering time of 1.5 min) was performed to form a nickel layer on the surface of the dielectric layer 6 as the high-melting-point metal layer 20 having a thickness of approx. 30 nm.

Moreover, oxygen gas was slowly leaked into the chamber of the sputtering vapor deposition system at a flow rate of 29 cm³/min, a tantalum target was used as the target, sputtering power was set to 1,500 W, presputtering time was set to 8 min, and sputtering time was set to 749.6 min to form a tantalum oxide film on the surface of the high-melting-point metal layer 20 as an inorganic-oxide sputter film having a thickness of approx. 1.0 μm.

As described above, a copper foil on whose one side the high-melting-point metal layer 20 and the tantalum oxide film were formed was taken out from the chamber of the sputtering vapor deposition system and the pit-like defective portion of the tantalum oxide film was sealed by polyimide resin similarly to the case of the Example 1. Thus, the dielectric-layer-provided copper foil 1D' shown in FIG. 3(b-2) was obtained.

<Manufacturing of Copper Clad Laminate for Forming Capacitor Layer>

A copper layer having a thickness of 0.5 μm and serving as the upper electrode forming layer 11 was formed on the surface of the dielectric layer 6 by using the dielectric-layer-provided copper foil 1D' obtained as described above. The sputtering vapor deposition system and basic sputtering condition used here were the same as the case of the Example 1.

Thus, the copper clad laminate 10i' for forming a capacitor layer formed by such four layers as the lower electrode forming layer 2, high-melting-point metal layer 20, dielectric layer 6, and upper electrode forming layer 11 shown in FIG. 15(b) was obtained. As a result of checking whether a short circuit occurred between the copper foil 2 serving as a lower electrode forming layer and the upper electrode forming layer 11 at 20 places under the state of the copper clad laminate thus manufactured, it was impossible to find a place where a short circuit occurred.

EXAMPLE 10

In the case of this example, the dielectric-layer-provided copper foil 1D' shown in FIG. 4(b-2) was manufactured in accordance with the manufacturing flow shown below and the copper clad laminate 10J' for forming a capacitor layer shown in FIG. 16(b) was manufactured by using the copper foil 1D'. This example used a very low profile (VLP) copper foil having a nominal thickness of 18 μm but not undergoing a surface treatment as the copper foil 2 serving as a lower electrode forming layer.

<Manufacturing of Dielectric-layer-provided Copper Foil>

Because manufacturing of the dielectric-layer-provided copper foil 1D' shown in FIG. 4(b-2) was the same as the case of the Example 9, its description was omitted in order to avoid duplicate description.

<Manufacturing of Copper Clad Laminate for Forming Capacitor Layer>

The binder metal layer 12 was formed by using the dielectric-layer-provided copper foil 1D' obtained as described above and applying the sputtering vapor deposition method to the surface of the dielectric layer 6. In the case of the binder metal layer 12, a chromium layer having a thickness of approx. 30 nm was formed on the surface of the dielectric layer 6 similarly to the case of the Example 2.

Moreover, a copper layer having a thickness of 0.5 μm and serving as the upper electrode forming layer 11 was formed on the chromium layer formed as the binder metal layer 12 by using the sputtering method same as the case of the Example 1.

Thus, the copper clad laminate 10J' for forming a capacitor layer formed by five layers consisting essentially of the lower electrode forming layer 2, high-melting-point metal layer 20, dielectric layer 6, binder metal layer 12, and upper electrode forming layer 11 shown in FIG. 16(b) was obtained. As a result of checking whether a short circuit occurred between the copper foil 2 serving as a lower electrode forming layer and the upper electrode forming layer 11 at 20 places under the state of the copper clad laminate thus manufactured, it was impossible to find a place where a short circuit occurred.

EXAMPLE 11

In the case of this example, the dielectric-layer-provided copper foil 1D' shown in FIG. 4(b-2) was manufactured in accordance with the manufacturing flow shown below and the copper clad laminate 10K' for forming a capacitor layer shown in FIG. 17(b) was manufactured by using the copper foil 1D'. This example used a very low profile (VLP) copper foil having a nominal thickness of 18 μm but not undergoing a surface treatment as the copper foil 2 serving as a lower electrode forming layer.

<Manufacturing of Dielectric-layer-provided Copper Foil>

Manufacturing of the dielectric-layer-provided copper foil 1D' shown in FIG. 4(b-2) was the same as the case of the Example 9, its description was omitted in order to avoid duplicate description.

<Manufacturing of Copper Clad Laminate for Forming Capacitor Layer>

The high-melting-point metal layer 20 was formed by using the dielectric-layer-provided copper foil 1D' obtained as described above and applying the sputtering vapor deposition method to the surface of the dielectric layer 6. The high-melting-point metal layer 20 was formed by using the sputtering vapor deposition method. In the case of the sputtering vapor deposition system and basic sputtering condition used in this case, cleaning by inverse sputtering like the case of forming the upper electrode forming layer 11 of the Example 1 was omitted, a nickel target was used as the target to be set in the chamber of the sputtering vapor deposition system, presputtering (presputtering power of 2,000 W and presputtering time of 5 min) was performed and film-forming sputtering (sputtering power of 2,000 W and sputtering time of 1.5 min) was performed to form a nickel layer having a thickness of approx. 30 nm on the surface of the dielectric layer 6.

Moreover, a copper layer having a thickness of 0.5 μm and serving as the upper electrode forming layer 11 was formed on the nickel layer formed as the high-melting-point metal layer 20 by using the sputtering method same as the case of the Example 1.

Thus, the copper clad laminate 10K' for forming a capacitor layer formed by five layers consisting essentially of the lower electrode forming layer 2, high-melting-point metal layer 20, dielectric layer 6, high-melting-point metal layer 20, and upper electrode forming layer 11 shown in FIG. 13(b) was obtained. As a result of checking whether a short circuit occurred between the copper foil 2 serving as a lower electrode forming layer and the upper electrode forming layer 11 at 20 places under the state of the copper clad laminate thus manufactured, it was impossible to find a place where a short circuit occurred.

EXAMPLE 12

In the case of this example, the dielectric-layer-provided copper foil 1D' shown in FIG. 4(b-2) was manufactured in accordance with the manufacturing flow shown below and the copper clad laminate 10L' for forming a capacitor layer shown in FIG. 18(b) was manufactured by using the copper foil 1D'. This example used a very low profile (VLP) copper foil having a nominal thickness of 18 μm but not undergoing a surface treatment as the copper foil 2 serving as a lower electrode forming layer.

<Manufacturing of Dielectric-layer-provided Copper Foil>

Because manufacturing of the dielectric-layer-provided copper foil 1D' shown in FIG. 4(b-2) was the same as the case of the Example 9, its description was omitted in order to avoid duplicate description.

<Manufacturing of Copper Clad Laminate for Forming Capacitor Layer>

A chromium layer having a thickness of 30 nm was formed as the binder metal layer 12 by using the dielectric-layer-provided copper foil 1D', applying the sputtering vapor deposition method to the surface of the dielectric layer 6, and using the sputtering method same as the case of the Example 2.

Moreover, a nickel layer having a thickness of 30 nm was formed on a chromium layer formed as the binder metal layer 12 similarly to the case of the Example 3 as the high-melting-point metal layer 20.

Furthermore, a copper layer having a thickness of 0.5 μm and serving as the upper electrode forming layer 11 was formed on the high-melting-point metal layer 20 by using the sputtering method same as the case of the Example 1.

Furthermore, the copper clad laminate 10L' for forming a capacitor layer, formed by six layers consisting essentially of the lower electrode forming layer 2, high-melting-point metal layer 20, dielectric layer 6, binder metal layer 12, high-melting-point metal layer 20, and upper electrode forming layer 11 shown in FIG. 18(b) was obtained. As a result of checking whether a short circuit occurred between the copper foil 2 serving as a lower electrode forming layer and the upper electrode forming layer 11 at 20 places under the state of the copper clad laminate thus manufactured, it was impossible to find a place where a short circuit occurred.

EXAMPLE 13

In the case of this example, the dielectric-layer-provided copper foil 1E' shown in FIG. 5(b-2) was manufactured in accordance with the manufacturing flow shown below and the copper clad laminate 10M' shown in FIG. 19(b) was manufactured by using the copper foil 1E'. This example used a very low profile (VLP) copper foil having a nominal thickness of 18 µm but not undergoing a surface treatment as the copper foil 2 serving as a lower electrode forming layer.

<Manufacturing of Dielectric-layer-provided Copper Foil>

First, the surface of a copper foil having a size of 70 mm×70 mm was acid-cleaned by 2N sulfuric acid solution (room temperature) to remove contaminant and extra oxide and dried. Then, the acid-cleaned copper foil was put in the chamber of the sputtering vapor deposition system (CFS-12F-100). Sputtering conditions were set so that the ultimate vacuum in the chamber was $1.2 \times 10^{-3}$ Pa and argon gas was supplied to an ion gun at a flow rate of 87 cm$^3$/min. Moreover, the surface of the copper foil whose acid cleaning was first completed was cleaned by inversely sputtering the surface with argon ions. The inverse sputtering conditions were set to inverse sputtering power of 1,000 W and inverse sputtering time of 10 min.

When inverse sputtering of the surface of the copper foil was completed, a nickel target was used as the target to be set in the chamber of the sputtering vapor deposition system, presputtering (presputtering power of 2,000 W and presputtering time of 5 min) was performed and film-forming sputtering (sputtering power of 2,000 W and sputtering time of 1.5 min) was performed to form a nickel layer on the surface of the dielectric layer 6 as the high-melting point metal layer 20 having a thickness of 30 nm.

Moreover, a chromium layer having a thickness of 30 nm was formed as the binder metal layer 12 on a nickel layer formed as the high-melting point metal layer 20 similarly to the case of the Example 5.

Furthermore, a tantalum oxide film having a thickness of approx. 1.0 µm serving as an inorganic-oxide sputter film was formed on the surface of the high-melting-point metal layer 20 by slowly leaking oxygen gas into the chamber of the sputtering vapor deposition system at a flow rate of 29 cm$^3$/min, using a tantalum target as the target, setting sputtering power to 1,500 W, presputtering time of 8 min, and sputtering time of 749.6 min.

Thus, a copper foil on whose one side the high-melting-point metal layer 20, binder metal layer 12, and tantalum oxide film were formed was taken out from the chamber of the sputtering vapor deposition system and the pit-like defective portion of the tantalum oxide film was sealed by polyimide resin similarly to the case of the Example 1. Thus, the dielectric-layer-provided copper foil 1E' shown in FIG. 5(b-2) was obtained.

<Manufacturing of Copper Clad Laminate for Forming Capacitor Layer>

A copper layer having a thickness of 0.5 µm and serving as the upper electrode forming layer 11 was formed on the surface of the dielectric layer 6 by using the dielectric-layer-provided copper foil 1E' thus obtained and applying the sputtering vapor deposition method. The sputtering vapor deposition system and basic sputtering condition used here were the same as the case of the Example 1.

Thus, the copper clad laminate 10M' for forming a capacitor layer formed by four layers consisting essentially of the lower electrode forming layer 2, high-melting-point metal layer 20, binder metal layer 12, dielectric layer 6, and upper electrode forming layer 11 shown in FIG. 15(b) was obtained. As a result of checking whether a short circuit occurred between the copper foil 2 serving as a lower electrode forming layer and the upper electrode forming layer 11 at 20 places under the state of the copper clad laminate thus manufactured, it was impossible to find a place where a short circuit occurred.

EXAMPLE 14

In the case of this example, the dielectric-layer-provided copper foil 1E' shown in FIG. 5(b-2) was manufactured in accordance with the manufacturing flow shown below and the copper clad laminate 10N' for forming a capacitor layer shown in FIG. 20(b) was manufactured by using the copper foil 1E'. This example used a very low profile (VLP) copper foil having a nominal thickness of 18 µm but not undergoing a surface treatment as the copper foil 2 serving as a lower electrode forming layer.

<Manufacturing of Dielectric-layer-provided Copper Foil>

Because manufacturing of the dielectric-layer-provided copper foil 1E' shown in FIG. 5(b-2) was the same as the case of the Example 13, its description was omitted in order to avoid duplicate description.

<Manufacturing of Copper Clad Laminate for Forming Capacitor Layer>

The binder metal layer 12 was formed by using the dielectric-layer-provided copper foil 1E' thus obtained and applying the sputtering vapor deposition method to the surface of the dielectric layer 6. In the case of the binder metal layer 12, a chromium layer having a thickness of approx. 30 nm was formed on the surface of the dielectric layer 6 similarly to the case of the Example 2.

Then, a copper layer having a thickness of 0.5 µm and serving as the upper electrode forming layer 11 was formed on the chromium layer formed as the binder metal layer 12 by using the sputtering method same as the case of the Example 1.

Thus, the copper clad laminate 10N' for forming a capacitor layer formed by six layers consisting essentially of the lower electrode forming layer 2, high-melting-point metal layer 20, binder metal layer 12, dielectric layer 6, binder metal layer 12, and upper electrode forming layer 11 shown in FIG. 20(b) was obtained. As a result of checking whether a short circuit occurred between the copper foil 2 serving as a lower electrode forming layer and the upper electrode forming layer 11 at 20 places under the state of the copper clad laminate thus manufactured, it was impossible to find a place where a short circuit occurred.

EXAMPLE 15

In the case of this example, the dielectric-layer-provided copper foil 1E' shown in FIG. 5(b-2) was manufactured in accordance with the manufacturing flow shown below and the copper clad laminate 10P' for forming a capacitor layer shown in FIG. 21(b) was manufactured by using the copper foil 1E'. This example used a very low profile (VLP) copper foil having a nominal thickness of 18 µm but not undergoing a surface treatment as the copper foil 2 serving as a lower electrode forming layer.

<Manufacturing of Dielectric-layer-provided Copper Foil>

Because manufacturing of the dielectric-layer-provided copper foil 1E' shown in FIG. 5(b-2) was the same as the case of the Example 13, its description was omitted in order to avoid duplicate description.

<Manufacturing of Copper Clad Laminate for Forming Capacitor Layer>

The high-melting-point metal layer 20 was formed by using the dielectric-layer-provided copper foil 1E' manufactured as described above and apply the sputtering vapor deposition method to the surface of the dielectric layer 6. The high-melting-point metal layer 20 was formed by using the sputtering vapor deposition method. In the case of the sputtering vapor deposition system and basic sputtering condition used in this case, cleaning by inverse sputtering like the case of forming the upper electrode forming layer 11 of the Example 1 was omitted, a nickel target was used for the target to be set in the chamber of the sputtering vapor deposition system, presputtering (presputtering power of 2,000 W and presputtering time of 5 min) was performed, and film-forming sputtering (sputtering power of 2,000 W and sputtering time of 1.5 min) to form a nickel layer having a thickness of 30 nm on the surface of the dielectric layer 6.

Moreover, a copper layer having a thickness of 1.0 μm and serving as the upper electrode forming layer 11 was formed on the nickel layer formed as the high-melting-point metal layer 20 by using the sputtering method same as the case of the Example 1.

Thus, the copper clad laminate 10P' for forming a capacitor layer formed by six layers consisting essentially of the lower electrode forming layer 2, high-melting-point metal layer 20, binder metal layer 12, dielectric layer 6, high-melting-point metal layer 20, and upper electrode forming layer 11 shown in FIG. 21(*b*) was obtained. As a result of checking whether a short circuit occurred between the copper foil 2 serving as a lower electrode forming layer and the upper electrode forming layer 11 at 20 places under the state of the copper clad laminate thus manufactured, it was impossible to find a place where a short circuit occurred.

EXAMPLE 16

In the case of this example, the dielectric-layer-provided copper foil 1E' shown in FIG. 5(*b*-2) was manufactured in accordance with the manufacturing flow shown below and the copper clad laminate 10Q' for forming a capacitor layer shown in FIG. 22(*b*) was manufactured by using the copper foil 1E'. This example used a very low profile (VLP) copper foil having a nominal thickness of 18 μm but not undergoing a surface treatment as the copper foil 2 serving as a lower electrode forming layer.

<Manufacturing of Dielectric-layer-provided Copper Foil>

Because manufacturing of the dielectric-layer-provided copper foil 1E' shown in FIG. 5(*b*-2) was the same as the case o the Example 13, its description was omitted in order to above duplicate description.

<Manufacturing of Copper Clad Laminate for Forming Capacitor Layer>

A chromium layer having a thickness of 30 nm was formed as the binder metal layer 12 by using the dielectric-layer-provided copper foil 1E' and applying the sputtering vapor deposition method to the surface of the dielectric layer 6, and using the sputtering method same as the case of the Example 2.

Moreover, a nickel layer having a thickness of 30 nm was formed as the high-melting-point metal layer 20 on the chromium layer formed as the binder metal layer 12 similarly to the case of the Example 15.

Furthermore, a copper layer having a thickness of 0.5 μm and serving as the upper electrode forming layer 11 was formed on the high-melting-point metal layer 20 by using the sputtering method same as the case of the Example 1.

Thus, the copper clad laminate 10Q' for forming a capacitor layer formed by seven layers consisting essentially of the lower electrode forming layer 2, high-melting-point metal layer 20, binder metal layer 12, dielectric layer 6, binder metal layer 12, high-melting point metal layer 20, and upper electrode forming layer 11 shown in FIG. 22(*b*) was obtained. As a result of checking whether a short circuit occurred between the copper foil 2 serving as a lower electrode forming layer and the upper electrode forming layer 11 at 20 places under the state of the copper clad laminate thus manufactured, it was impossible to find a place where a short circuit occurred.

EXAMPLES 17 TO 32

In the case of the examples, dielectric fillers were used by dispersing them in the polyimide electrodeposited solution used for sealing by polyimide resin used for the Examples 1 to 16. Therefore, the Examples 17 to 32 change sealing of the Examples 1 to 16 to the following method.

<Manufacturing of Dielectric-layer-provided Copper Foil>

In this case, only sealing was described but description on overlapped portions was omitted. In the case of the electrodeposition method used for sealing of the Examples 17 to 32, dielectric fillers were used by dispersing them in the polyimide electrodeposited solution. The polyimide electrodeposited solution user here was the same as that used for the Example 1 and barium titanate powder serving as dielectric fillers having the powder characteristic shown below was mixed and dispersed in the polyimide electrodeposited solution. The mixing rate was set so as to be 80 wt % of the polyimide solid content of the above dielectric-filler-containing polyimide electrodeposited solution.

| Powder characteristic of dielectric filler | |
|---|---|
| Average particle diameter ($D_{IA}$) | 0.25 μm |
| Accumulated particle diameter ($D_{50}$) | 0.5 μm |
| Coherence degree ($D_{50}/D_{IA}$) | 2.0 |

The pit-like defective portion of the tantalum oxide film was embedded with the dielectric-filler-containing polyimide electrodeposited solution manufactured as described above and a polyimide resin film in which dielectric fillers were dispersed was formed on the surface of the tantalum oxide film. The electrodeposition conditions in this case were set so that the temperature of the polyimide electrodeposited solution was 25° C., a copper foil on which a tantalum oxide film was formed as a positive electrode, a stainless steel plate was used as a negative electrode, a DC voltage of 15 V was applied, and electrolysis was performed for 5 min. Thereby, polyimide resin was electrodeposited, the pit-like defective portion of the tantalum oxide film was embedded, a polyimide resin film having a thickness of approx. 0.4 μm was formed on the surface of the tantalum oxide film, and rinsed and dried. Thereby, the dielectric-layer-provided copper foils 1A', 1B', 1C', 1D', and 1E' described in the Examples 1 to 16 were obtained.

<Manufacturing of Copper Clad Laminate for Forming Capacitor Layer>

By using the dielectric-layer-provided copper foils 1A', 1B', 1C', 1D', and 1E' obtained as described above, the copper clad laminates (10A', 10B', 10C', 10D', 10E', 10F', 10G', 10H', 10i', 10J', 10K', 10L', 10M', 10N', 10P', and 10Q') were realized similarly to the case of steps of the Examples 1 to 16.

As a result of checking whether a short circuit occurred between the copper foil 2 serving as a lower electrode forming layer and the upper electrode forming layer 11 at 20 places under the state of the copper clad laminates thus manufactured, it was impossible to find a place where a short circuit occurred.

EXAMPLES 33 TO 48

<Manufacturing of Dielectric-layer-provided Copper Foil>

Each of the example shown here used the carrier-foil-provided copper foil shown in FIG. 2(a) instead of the copper foil 2 used for the Examples 1 to 16. In the case of the carrier-foil-provided copper foil, a junction interface layer was formed on the glossy face of an electrolytic copper foil having a thickness of 35 µm as a carrier foil and a copper foil layer having a thickness of 5 µm was formed on the junction interface layer. The junction interface layer was formed by carboxybenzotriazole. Therefore, it was unnecessary to describe steps.

<Manufacturing of Copper Clad Laminate for Forming Capacitor Layer>

Figure 6:
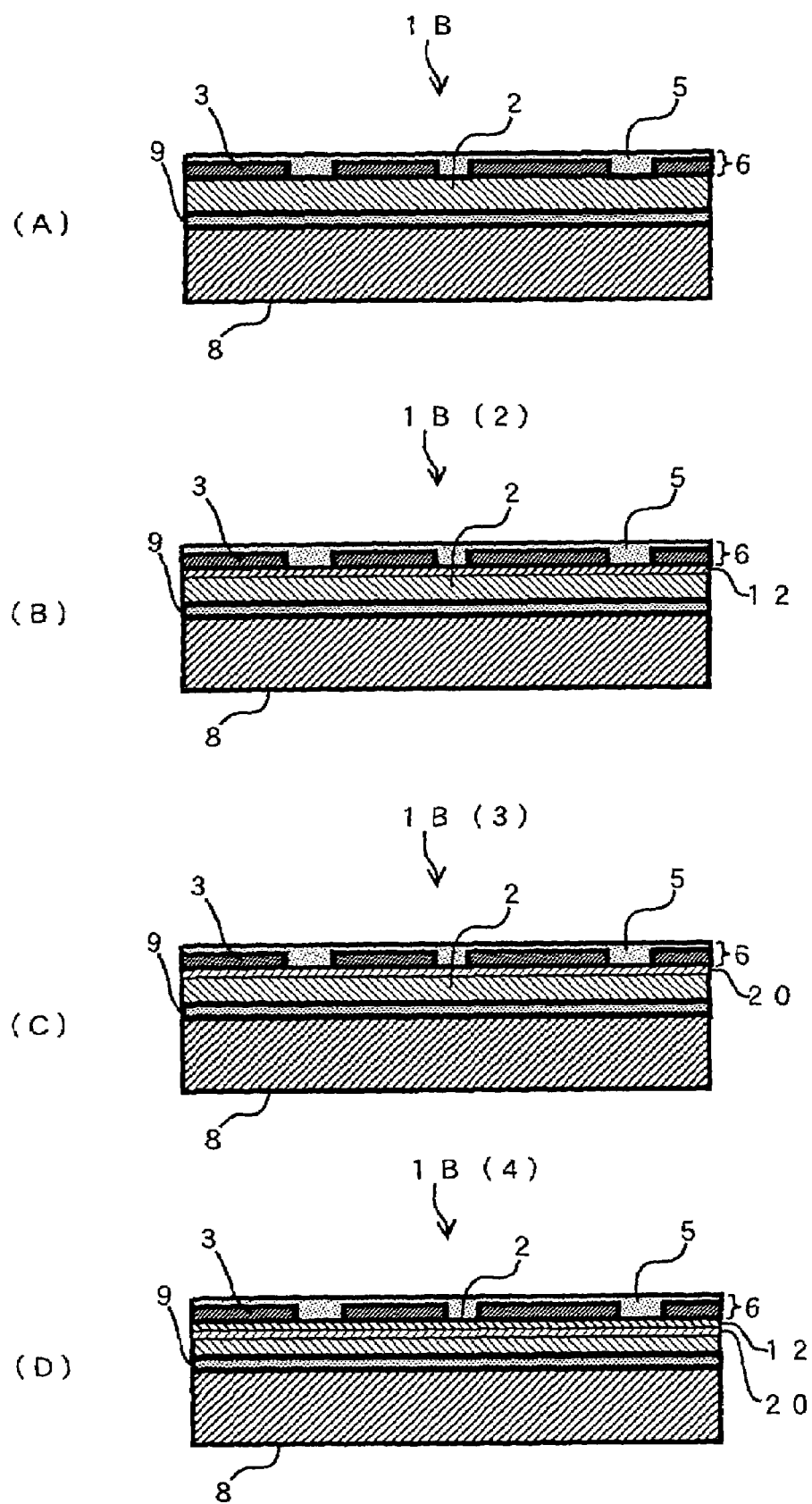

By using the dielectric-layer-provides copper foils 1B, 1B(2), 1B(3), and 1B(4) shown in FIG. 6 obtained as described above, a layer configuration same as the layer configuration of each of the copper clad laminates (10A', 10B', 1° C.', 10D', 10E', 10F', 10G', 10H', 10i', 10J', 10K', 10L', 10M', 10N', 10P', and 1Q') shown in FIG. 6 was realized similarly to each of steps of the Examples 1 to 16.

As a result of checking whether a short circuit occurred between the copper foil 2 serving as a lower electrode forming layer and the upper electrode forming layer 11 at 20 places under the state of the copper clad laminates thus manufactured, it was impossible to find a place where a short circuit occurred.

EXAMPLE 49

This example was only different from the Example 1 in that chromium was used for the upper electrode forming layer of the Example 1. Therefore, description of portions duplicate with those of the Example 1 was omitted.

<Manufacturing of Dielectric-layer-provided Copper Foil>

This step was completely the same as the case of the Example 1. Therefore, description here was omitted.

<Manufacturing of Copper Clad Laminate for Forming Capacitor Layer>

A chromium layer having a thickness of 30 nm was formed as the upper electrode forming layer 11 by using the dielectric-layer-provided copper foil 1A' obtained as described above shown in FIG. 1(b-2) and applying the sputtering vapor deposition method to the surface of the dielectric layer 6.

Though the sputtering vapor deposition system and basic sputtering condition used in this case were the same as the above described, cleaning by inverse sputtering was omitted. Moreover, a chromium target was sued for the target to be set in the chamber of the sputtering vapor deposition system, presputtering (presputtering power of 1,000 W and presputtering time of 5 min) was performed, and film-forming sputtering (sputtering power of 2,000 W and sputtering time of 1.3 min) was performed to form a chromium layer having a thickness of approx. 30 nm serving as the upper electrode forming layer 11 on the surface of the dielectric layer 6.

Thus, the copper clad laminate 10A' for forming a capacitor layer formed by such three layers as the lower electrode forming layer 2, dielectric layer 6, and upper electrode forming layer 11 shown in FIG. 7(b) was obtained. Moreover, as a result of checking whether a short circuit occurred between the copper foil 2 serving as a lower electrode forming layer and the upper electrode forming layer 11 at 20 places under the state of a copper clad laminate similarly to the case of the Example 1, it was impossible to find a place where a short circuit occurred.

EXAMPLE 50

In the case of this example, a nickel-cobalt-alloy film was applied as the high-melting-point metal layer 20 of each of the Examples 9 to 16. Moreover, as for the other features, the dielectric-layer-provided copper foils 1D' and 1E'and the copper clad laminates 10i, 10J', 10K', 10L', 10M', 10N', 10P', and 10Q' for respectively forming a capacitor layer were manufactured in accordance with the procedure of each of the Examples 9 to 16. Therefore, only formation of the high-melting-point metal layer 20 was described.

<Manufacturing of High-melting-point Metal Layer>

First, the surface of a copper foil having a size of 70 mm×70 mm was acid-cleaned with 2N sulfuric acid solution (room temperature) to remove contaminant and extra oxide and dried. Then, a nickel-cobalt-alloy film was formed on the surface of the acid-cleaned copper foil as a high-melting-point metal layer using the electrolytic method. In this case, the nickel-cobalt-alloy film was electrolyzed in accordance with conditions of 130 g/l of cobalt sulfate, 100 g/l of nickel sulfate, 30 g/l of boric acid, 12.5 g/l of potassium chloride, 8 g/l of sodium dihydrogenphosphate, solution temperature of 40° C., pH of 4.0, and current density of 7A/dm$^2$ to uniformly electrocyrstallize a nickel-cobalt-alloy film having a thickness of 0.5 µm.

As a result of checking whether a short circuit occurred between the copper foil 2 serving as a lower electrode forming layer and the upper electrode forming layer 11 at 20 places under the state of the copper clad laminate thus manufactured, it was impossible to find a place where a short circuit occurred.

COMPARATIVE EXAMPLE

In the case of this comparative example, a copper clad laminate for forming a capacitor layer was manufactured in accordance with a manufacturing flow almost same as the case of the Example 1. This comparative example was different from the Example 1 in that a dielectric layer does not undergo the sealing by polyimide resin. Therefore, the dielectric layer was constituted by only a tantalum oxide film.

<Manufacturing of Dielectric-layer-provided Copper Foil>

Acid-cleaning of the copper foil 2 and formation of a tantalum oxide film by the sputtering vapor deposition method were the same as the case of the Example 1. Moreover, a copper foil on which the tantalum oxide film was formed was taken out from the chamber of the sputtering vapor deposition system. The copper foil was used as a dielectric-layer-provided copper foil under this state.

<Manufacturing of Copper Clad Laminate for Forming Capacitor Layer>

A copper layer having a thickness of 0.5 μm serving as an upper electrode forming layer was formed by using the dielectric-layer-provided copper foil thus manufactured and applying the sputtering vapor deposition method to the surface of the dielectric layer of the copper foil similarly to the case of the Example 1. As a result of checking whether a short circuit occurred between a copper foil serving as a lower electrode forming layer and an upper electrode forming layer at 20 places under the state of the copper clad laminate thus manufactured, it was possible to find eight places where a short circuit occurred.

INDUSTRIAL APPLICABILITY

A dielectric-layer-provided copper foil of the present invention is suitable for manufacturing of a built-in capacitor substrate of a printed wiring board. Moreover, because a copper clad laminate for forming a capacitor layer manufactured by using the dielectric-layer-provided copper foil has a uniform thickness though a dielectric layer is thin and is able to effectively prevent a short circuit from occurring between a lower electrode and an upper electrode after a capacitor circuit is formed, it is possible to extremely improve the production yield of copper clad laminates respectively having a capacitor circuit.

The invention claimed is:

1. A dielectric-layer-provided copper foil, suitable for forming a capacitor layer, the foil having a dielectric layer formed on one side thereof, wherein:
   said dielectric layer is an inorganic-oxide sputter film formed on one side of the copper foil by a sputtering vapor deposition method,
   wherein the inorganic-oxide sputter film has a thickness of 1.0 μm or less and has pit-like defective portions disposed therein,
   wherein at least the pit-like defective portions are sealed by a polyimide resin and
   wherein the inorganic-oxide sputter film is formed from at least one of the group consisting of aluminum oxide, tantalum oxide, barium titanate and combinations thereof.

2. The dielectric-layer-provided copper foil of claim 1 wherein:
   a binder metal layer is interposed between the copper foil layer and the dielectric layer.

3. The dielectric-layer-provided copper foil of claim 2, wherein:
   the binder metal layer is formed from one of the group selected from cobalt, chromium, nickel, nickel-chromium alloy, zirconium, palladium, molybdenum, tungsten, titanium, aluminum, platinum, and an alloy of one of these metals.

4. A copper clad laminate for forming a capacitor layer, using the copper foil layer of the dielectric-layer-provided copper foil of claim 2 as a lower electrode forming layer, wherein:
   an upper electrode forming layer is formed on the dielectric layer to provide a four-layer configuration consisting essentially of a lower electrode forming layer, a binder metal layer, a dielectric layer, and an upper electrode forming layer.

5. A copper clad laminate for forming a capacitor layer, using the copper foil layer of the dielectric-layer-provided copper foil of claim 2 as a lower electrode forming layer, wherein:
   the binder metal layer and an upper electrode forming layer are formed on the dielectric layer to provide a five-layer configuration consisting essentially of a lower electrode forming layer, a binder metal layer, a dielectric layer, a binder metal layer, and an upper electrode forming layer.

6. A copper clad laminate for forming a capacitor layer, using the copper foil layer of the dielectric-layer-provided copper foil of claim 2 as a lower electrode forming layer, wherein:
   a high-melting-point metal layer and an upper electrode forming layer are formed on the dielectric layer to provide a five-layer configuration consisting essentially of a lower electrode forming layer, a binder metal layer, a dielectric layer, a high-melting-point metal layer, and an upper electrode forming layer.

7. A copper clad laminate for forming a capacitor layer, using the copper foil layer of the dielectric-layer-provided copper foil of claim 2 as a lower electrode forming layer, wherein:
   a high-melting-point metal layer, a binder metal layer, and an upper electrode forming layer are formed on the dielectric layer to provide a six-layer configuration consisting essentially of a lower electrode forming layer, a binder metal layer, a dielectric layer, a binder metal layer, a high-melting-point metal layer, and an upper electrode forming layer.

8. A method for manufacturing a dielectric-layer-provided copper foil of claim 2, said method comprising:
   forming the binder metal layer on the one side of a copper foil,
   forming the inorganic-oxide sputter film having a thickness of 1.0 μm or less on the binder metal layer by using a sputtering vapor deposition method, and
   embedding and sealing at least a pit-like defective portion generated on the inorganic-oxide sputter film with a dielectric filler containing polyimide resin by a polyimide-resin electrodeposition method.

9. A method for manufacturing a dielectric-layer-provided copper foil according to claim 8, said method further comprising:
   using a polyimide-resin electrodeposition method wherein an electrodeposition solution contains a dielectric-filler containing polyimide, and
   wherein a dielectric powder having a substantially-spherical perovskite structure in which an average particle diameter $D_{IA}$ ranges between 0.05 and 1.0 μm, an accumulated particle diameter $D_{50}$ according to the laser-diffraction-scattering particle-size-distribution measuring method ranges between 0.1 and 2.0 μm, and the value of coherence degree shown as $D_{50}/D_{IA}$ by using the accumulated particle diameter $D_{50}$ and the average particle diameter $D_{IA}$ obtained from an image analysis is 4.5 or less is used for the dielectric fillers.

10. A method for manufacturing a dielectric-layer-provided copper foil according to claim 9, wherein:
    an amount of dielectric fillers in a dielectric-filler-containing polyimide electrodeposited solution ranges between 75 and 90 wt %.

11. The dielectric-layer-provided copper foil of claim 1, wherein:
    a high-melting-point metal layer is interposed between the copper foil layer and the dielectric layer.

12. The dielectric-layer-provided copper foil of claim 11, wherein:

the high-melting-point metal layer is formed from one of the group selected from nickel, chromium, molybdenum, platinum, titanium, tungsten, and an alloy of one of these metals.

13. The dielectric-layer-provided copper foil of claim 11, wherein:
the high-melting-point metal layer and the binder metal layer are formed between the copper foil layer and the dielectric layer.

14. A copper clad laminate for forming a capacitor layer, using the copper foil layer of the dielectric-layer-provided copper foil of claim 13 as a lower electrode forming layer, wherein:
an upper electrode forming layer is formed on the dielectric layer to provide a five-layer configuration consisting essentially of a lower electrode forming layer, a high-melting-point metal layer, a binder metal layer, a dielectric layer, and an upper electrode forming layer.

15. A copper clad laminate for forming a capacitor layer, using the copper foil layer of the dielectric-layer-provided copper foil of claim 13 as a lower electrode forming layer, wherein:
a binder metal layer and an upper electrode forming layer are formed on the dielectric layer to provide a six-layer configuration consisting essentially of a lower electrode forming layer, a high-melting-point metal layer, a binder metal layer, a dielectric layer, a binder metal layer, and an upper electrode forming layer.

16. A copper clad laminate for forming a capacitor layer, using the copper foil layer of the dielectric-layer-provided copper foil of claim 13 as a lower electrode forming layer, wherein:
the high-melting-point metal layer and an upper electrode forming layer are formed on the dielectric layer to provide a six-layer configuration consisting essentially of a lower electrode forming layer, a high-melting-point metal layer, a binder metal layer, a dielectric layer, a high-melting-point metal layer, and an upper electrode forming layer.

17. A copper clad laminate for forming a capacitor layer, using the copper foil layer of the dielectric-layer-provided copper foil of claim 13 as a lower electrode forming layer, wherein:
the high-melting-point metal layer, a binder metal layer, and an upper electrode forming layer are formed on the dielectric layer to provide a seven-layer configuration consisting essentially of a lower electrode forming layer, a high-melting-point metal layer, a binder metal layer, a dielectric layer, a binder metal layer, a high-melting-point metal layer, and an upper electrode forming layer.

18. A method for manufacturing a dielectric-layer-provided copper foil according to claim 13, said method comprising:
forming the high-melting-point metal layer on the one side of a copper foil,
forming the binder metal layer on the high-melting-point metal layer,
forming the inorganic-oxide sputter film having a thickness of 1.0 μm or less on the binder metal layer by using a sputtering vapor deposition method, and embedding and sealing at least a pit-like defective portion generated on the inorganic-oxide sputter film with a dielectric filler containing polyimide resin by a polyimide-resin electrodeposition method.

19. A copper clad laminate for forming a capacitor layer, using the copper foil layer of the dielectric-layer-provided copper foil of claim 11 as a lower electrode forming layer, wherein:
an upper electrode forming layer is formed on the dielectric layer to provide a four-layer configuration consisting essentially of a lower electrode forming layer, a high-melting-point metal layer, a dielectric layer, and an upper electrode forming layer.

20. A copper clad laminate for forming a capacitor layer, using the copper foil layer of the dielectric-layer-provided copper foil of claim 11 as a lower electrode forming layer, wherein:
a binder metal layer and an upper electrode forming layer are formed on the dielectric layer to provide a five-layer configuration consisting essentially of a lower electrode forming layer, a high-melting-point metal layer, a dielectric layer, a binder metal layer, and an upper electrode forming layer.

21. A copper clad laminate for forming a capacitor layer, using the copper foil layer of the dielectric-layer-provided copper foil of claim 11 as a lower electrode forming layer, wherein:
a high-melting-point metal layer and an upper electrode forming layer are formed on the dielectric layer to provide a five-layer configuration consisting essentially of a lower electrode forming layer, a high-melting-point metal layer, a dielectric layer, a high-melting-point metal layer, and an upper electrode forming layer.

22. A copper clad laminate for forming a capacitor layer, using the copper foil layer of the dielectric-layer-provided copper foil of claim 11 as a lower electrode forming layer, wherein:
a high-melting-point metal layer, a binder metal layer, and an upper electrode forming layer are formed on the dielectric layer to provide a six-layer configuration consisting essentially of a lower electrode forming layer, a high-melting-point metal layer, a dielectric layer, a binder metal layer, a high-melting-point metal layer, and an upper electrode forming layer.

23. A method for manufacturing a dielectric-layer-provided copper foil according to claim 11, said method comprising:
forming the high-melting-point metal layer on the one side of a copper foil,
forming the inorganic-oxide sputter film having a thickness of 1.0 μm or less on the high-melting-point metal layer by using a sputtering vapor deposition method and
embedding and sealing at least a pit-like defective portion generated on the inorganic-oxide sputter film with a dielectric filler containing polyimide resin by a polyimide-resin electrodeposition method.

24. A copper clad laminate for forming a capacitor layer, using the copper foil layer of the dielectric-layer-provided copper foil of claim 1 as a lower electrode forming layer, wherein:
an upper electrode forming layer is formed on the dielectric layer to provide a three-layer configuration consisting essentially of a lower electrode forming layer, a dielectric layer, and an upper electrode forming layer.

25. A copper clad laminate for forming a capacitor layer using the dielectric-layer-provided copper foil of claim 24, wherein:
the upper electrode forming layer uses a member selected from the group consisting essentially of copper, aluminum, silver, and gold.

26. The copper clad laminate for forming a capacitor layer, using the copper foil layer of the dielectric-layer-provided copper foil of claim 1 as a lower electrode forming layer, wherein:

a binder metal layer and an upper electrode forming layer are formed on the dielectric layer to provide a four-layer configuration consisting essentially of a lower electrode forming layer, a dielectric layer, a binder metal layer, and an upper electrode forming layer.

27. A copper clad laminate for forming a capacitor layer, using the copper foil layer of the dielectric-layer-provided copper foil of claim 1 as a lower electrode forming layer, wherein:

a high-melting-point metal layer and an upper electrode forming layer are formed on the dielectric layer to provide a four-layer configuration consisting essentially of a lower electrode forming layer, a dielectric layer, a high-melting-point metal layer, and an upper electrode forming layer.

28. A copper clad laminate for forming a capacitor layer, using the copper foil layer of the dielectric-layer-provided copper foil of claim 1 as a lower electrode forming layer, wherein:

a high-melting-point metal layer, a binder metal layer, and an upper electrode forming layer are formed on the dielectric layer to provide a five-layer configuration consisting essentially of a lower electrode forming layer, a dielectric layer, a binder metal layer, a high-melting-point metal layer, and an upper electrode forming layer.

29. A method for manufacturing the dielectric-layer-provided copper foil of claim 1, said method comprising:

forming the inorganic-oxide sputter film having a thickness of 1.0 μm or less on one side of the copper foil by using a sputtering vapor deposition method, and embedding and sealing at least a pit-like defective portion generated on the inorganic-oxide sputter film with a dielectric filler containing polyimide resin by a polyimide-resin electrodeposition method.

* * * * *